United States Patent
Ejima et al.

(10) Patent No.: US 8,002,542 B2
(45) Date of Patent: Aug. 23, 2011

(54) HEAT TREATMENT JIG AND HEAT TREATMENT JIG SET

(75) Inventors: Daisuke Ejima, Kawasaki (JP); Tsuyoshi Kida, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 714 days.

(21) Appl. No.: 11/822,337

(22) Filed: Jul. 5, 2007

(65) Prior Publication Data

US 2008/0012193 A1      Jan. 17, 2008

(30) Foreign Application Priority Data

Jul. 14, 2006   (JP) .................................. 2006-193520

(51) Int. Cl.
 *F27D 5/00* (2006.01)
(52) U.S. Cl. ........................................ 432/258; 118/728
(58) Field of Classification Search ................. 432/253, 432/258, 259, 254.2; 211/41.18; 118/725, 118/728
See application file for complete search history.

(56) References Cited

U.S. PATENT DOCUMENTS

| | | | | |
|---|---|---|---|---|
| 4,978,567 A | * | 12/1990 | Miller | 428/157 |
| 5,427,620 A | * | 6/1995 | deBoer et al. | 118/725 |
| 5,755,570 A | * | 5/1998 | Shinde et al. | 432/253 |
| 5,837,555 A | * | 11/1998 | Kaltenbrunner et al. | 438/796 |
| 6,332,946 B1 | * | 12/2001 | Emmett et al. | 156/299 |
| 6,446,818 B1 | * | 9/2002 | Dubey et al. | 211/41.18 |
| 6,488,158 B1 | * | 12/2002 | Khan et al. | 211/41.18 |
| 6,709,267 B1 | * | 3/2004 | Hawkins et al. | 432/258 |
| 6,887,723 B1 | * | 5/2005 | Ondricek et al. | 438/14 |
| 7,329,947 B2 | * | 2/2008 | Adachi et al. | 257/706 |
| 7,331,780 B2 | * | 2/2008 | Adachi | 432/253 |
| 7,407,359 B2 | * | 8/2008 | Sisson | 414/404 |
| 2008/0012193 A1 | * | 1/2008 | Ejima et al. | 269/287 |

FOREIGN PATENT DOCUMENTS

| | | |
|---|---|---|
| JP | 9-97973 | 4/1997 |
| JP | 10-284639 | 10/1998 |
| JP | 11-40901 | 2/1999 |
| JP | 2000-228566 | 8/2000 |
| JP | 2000-349110 | 12/2000 |
| JP | 2002-204097 | 7/2002 |

OTHER PUBLICATIONS

Japanese Official Action - 2006-193520 - Jan. 4, 2011.

* cited by examiner

*Primary Examiner* — Gregory A Wilson
(74) *Attorney, Agent, or Firm* — Young & Thompson

(57) ABSTRACT

A heat treatment jig includes a holding concave portion to hold an object and a void part formed near the holding concave portion and a thermal history variation of the object in a heat treatment process is reduced thereby.

11 Claims, 36 Drawing Sheets

RELATED ART

RELATED ART

RELATED ART

RELATED ART

HEAT TREATMENT JIG AND HEAT TREATMENT JIG SET

BACKGROUND OF THE INVENTION

1. Field of the Invention

The present invention relates to a heat treatment jig mounting and holding an object and a heat treatment jig set having the heat treatment jig and a jig cover mounted to the top face thereof.

2. Description of Related Art

In a manufacturing process of a semiconductor device, there is a step of jointing semiconductor components (semiconductor chip, chip capacitor and chip resistor or the like) with wiring board, jointing a pair of semiconductor devices or semiconductor components (a pair of semiconductor chips etc.) (hereinafter also referred to as a pair of semiconductor components) using jointing medium such as solder and adhesive.

One of the jointing methods is that a pair of semiconductor components or the like is mounted and held to a heat treatment jig and the pair of semiconductor components having jointing parts contacting one another is given a heat treatment by a reflow oven. FIG. 30 is a schematic explanation diagram of a semiconductor device 20 having a basic configuration including a wiring substrate 21 and chip components 22 such as a chip capacitor and chip resistance. The above jointing method is used to joint the chip components 22 to the wiring substrate 21, for example In a manufacturing process of a semiconductor device or the like having a package-on-package configuration which is a technique for jointing a pair of semiconductor devices, flip-chip configuration which is a technique for jointing a semiconductor chip to a wiring substrate and chip-on-chip configuration which is a technique for jointing a semiconductor chip to another semiconductor chip, the above jointing method is used.

Details of the semiconductor device having a package-on-package configuration, flip-chip configuration or chip-on-chip configuration are described hereinafter in detail.

[Package-On-Package Configuration Semiconductor Device]

As a complementary technology to the technology called SoC (System on Chip) that realizes a system on one Si (silicon), a technology called SiP (System in Package) is attracting attentions, in which the technology realizes several functions including memory and CPU (Central Processing Unit) by one package implementation.

The package-on-package technology is a next generation technology in the SiP technology and it is the technology for laminating packages. FIG. 31 is a schematic explanation diagram of a semiconductor device 30 having a package-on-package configuration. As shown in FIG. 31, for the semiconductor device 30, a bottom package 31 and a top package 32 are jointed by the above jointing method. The bottom package 31 includes a bottom package side wiring substrate 33, land 34, bottom package side semiconductor chip 35, bumps 36, underfill resin 37 and solder balls 38 etc. The top package 32 includes a top package side wiring substrate 40, top package side semiconductor chip 41, chip mounting adhesive 42, bonding wire 43 and mold resin 44 etc. Advantages of the package-on-package technology are listed below as compared to the chip stack (laminated) technology, which is the mainstream of current SiP technology.

Improvement of production efficiency such as yield and ease of test and cost improvement Easy problem analysis when a failure occurred Higher speed and integration by enabling to implement passive components together Applicability to many applications as commercial packages can be mounted Improvement of design flexibility by the ability to support modular feature and shape Jointing a semiconductor device having a package-on-package configuration can be carried out by the following method. Firstly, diced bottom package 31 is held to a heat treatment jig and the top package is mounted thereon using a mounter or the like. Then the heat treatment jig is thrown into a reflow oven to be heated. This makes the bottom package 31 and top package 32 jointed.

[Flip-Chip Bonding Configuration Semiconductor Device]

A general semiconductor device includes a semiconductor chip with a plurality of circuit devices formed on a Si substrate mounted to a wiring substrate or the like. Further, in order to fulfill requested circuit operations and functions, each circuit device is connected to one another.

For the semiconductor device having a flip-chip bonding configuration, a connection between semiconductor chip and wiring substrate is formed by directly jointing the wiring substrate and circuit face of the semiconductor chip opposing to each other. FIG. 32 is a schematic explanation diagram of a semiconductor device 50 having the flip-chip bonding configuration. As shown in FIG. 32, the semiconductor device 50 includes a wiring substrate 53, land 54, semiconductor chip 55, solder bumps 56, underfill resin 57 and solder balls 58 etc. In the flip-chip bonding technology, a conducting distance to a wiring substrate is shorter than the wire bonding technology using thin metallic lines. Thus the flip-chip bonding technology has advantages such that it is excellent in high-speed transmission.

For the semiconductor device 50 having a flip-chip bonding configuration, there are solder bumps 56 using gold stud bumps formed by gold wire and solder bumps 56 using solder bumps to pads of the semiconductor chip 55. Further, solder is sometimes pre-coated to pads of the wiring substrate 53.

[Chip-On-chip Configuration Semiconductor Device]

Chip-on technology is a technology for jointing circuit faces of a pair of semiconductor chips opposing to each other using the flip-chip bonding technology. Chip-on-chip configuration semiconductor device has advantages such as a signal can be communicated at high-speed between semiconductor chips.

FIG. 33 is a schematic explanation diagram of a semiconductor device 60 having a chip-on-chip configuration. As shown in FIG. 33, the semiconductor device 60 includes a wiring substrate 63, lands 64, first semiconductor chip 65, bumps 66, underfill resin 67, solder balls 68, second semiconductor chip 71, chip mounting adhesive 72, bonding wire 73 and mold resin 74 or the like. To joint a semiconductor device having a chip-on-chip configuration, diced first semiconductor chip 65 or wiring substrate 63 having diced first semiconductor chip 65 mounted thereto is inserted to a heat treatment jig (not shown) and fixed. Then the second semiconductor chip 71 having bumps 66 formed to the circuit face is mounted thereon by a mounter (not shown) or the like. After that, by throwing the heat treatment jig into a reflow oven to be heated, the semiconductor chips are jointed.

A joint process using the heat treatment jig is carried out in manufacturing various semiconductor devices as set forth above.

A transfer jig having a push-back configuration in which a semiconductor device is held by a through-hole is disclosed in Japanese Unexamined Patent Application Publication No.

10-284639. Japanese Unexamined Patent Application Publication No. 10-284639 also discloses that a slit is formed around the through-hole.

The transfer jig disclosed in Japanese Unexamined Patent Application Publication No. 10-284639 has a push-back configuration, where lateral surface of the semiconductor device is held by inner surface of the through-hole provided to the transfer jig. However as the transfer jig and semiconductor device is made from different material, the coefficient of thermal expansion also differs.

Thus, when performing a reflow process on a semiconductor device using the transfer jig disclosed in Japanese Unexamined Patent Application Publication No. 10-284639, stress is generated to the semiconductor device from the transfer jig or problems can easily occur such as the semiconductor device falls from the transfer jig.

Incidentally, Japanese Unexamined Patent Application Publication No. 2000-228566 discloses an assembled print wiring board having a configuration in which a plurality of circuit patterns to be semiconductors are arranged and formed on a print wiring substrate. Japanese Unexamined Patent Application Publication No. 2000-228566 further discloses that a dummy pattern for additional strength is formed outside the array of circuit patterns on the assembled print wiring board and a slit is formed between the dummy pattern and circuit patterns.

A circuit device in which circuit components are mounted to a circuit board is disclosed in Japanese Unexamined Patent Application Publication No. 11-040901. Japanese Unexamined Patent Application Publication No. 11-040901 further discloses that a slit is formed around the circuit component on the circuit board so as to restrict heat conduction from the heating circuit components to the circuit board. However in Japanese Unexamined Patent Application Publication No. 2000-228566 and No. 11-040901, a jig for holding a semiconductor device is not disclosed.

A heat treatment jig for holding an object such as semiconductor device is made from metal etc. resistant to the temperature for reflow. Thus the heat capacity of the heat treatment jig itself cannot be ignored. When performing a reflow process with an object such as semiconductor device being held to a jig, heat capacity of the jig affects the object. Thus, at a reflow process, thermal history variation (variation in reflow profile) depending on outside or central parts of the object is created. Further, when simultaneously processing a plurality of objects, reflow profile differs depending on the position to insert the objects mounted in a jig.

In order to improve the reliability of object such as semiconductor device or the like, it is preferable to set a reflow temperature as low as possible in a temperature area in which a joint member such as solder melts. However a large variation in temperatures of the objects as above, the temperature must be set in consideration of the part in which the temperature is hard to increase at a reflow, so as to avoid a problem in jointing caused by solder not melted. Thus the setting temperature must be set relatively high.

However if the setting temperature is set to high, the temperature may increase too high in the position where the temperature is apt to increase at a reflow. In such case, warping or the like is generated due to a difference in coefficient of thermal expansion of materials and it causes various problems in assembility and reliability.

SUMMARY

According to an aspect of the present invention, there is provided a heat treatment jig that includes a holding concave portion to hold an object and a void part formed near the holding concave portion, and a thermal history variation of the object in a heat treatment process is reduced thereby. As the void part is provided near the holding concave portion, heat capacity of the part adjacent to the object held by the holding concave portion can be reduced. Thus, when mounting an object to a heat treatment and performing a reflow process, it is possible to improve in reducing thermal history variation (variation in reflow profile) depending on the position inside the object. Further, for a heat treatment jig holding a plurality of objects to perform a reflow process, it is possible to improve in reducing thermal history variation (variation in reflow profile) depending on the position to insert the objects. Thus, to perform a reflow process on the object such as semiconductor device, the reflow temperature can be minimum thereby improving the reliability.

According to another aspect of the present invention, there is provided a heat treatment jig set that includes a heat treatment jig including a substrate having a holding concave portion formed to a top face to hold an object and a void part formed near an inner wall of the holding concave portion and a detachable jig cover mounted to a top face of the heat treatment jig to hold at least a part of the object held by the holding concave portion. With the heat treatment jig set according to the present invention, as it uses the jig cover, the object can be held by the holding concave portion of the heat treatment jig in more definitive way. Further as described above, it is possible to improve in reducing thermal history variation of the object.

Incidentally, the holding concave portion in the present invention includes a bottom portion and holds at least a part of the bottom face of an object by at least a part of the top face of the bottom portion of the holding concave portion.

The heat treatment jig according to the present invention has an excellent effect in improvement of reducing to generate thermal history variation of the object mounted to the heat treatment jig. Further, the heat treatment jig set according to the present invention has excellent effects in improvement of reducing to generate thermal history variation of the object mounted to the heat treatment jig and also holding the object in more definitive way.

BRIEF DESCRIPTION OF THE DRAWINGS

The above and other objects, advantages and features of the present invention will be more apparent from description of certain preferred embodiments taken in conjunction with the accompanying, in which.

DETAILED DESCRIPTION OF THE PREFERRED EMBODIMENTS

Figure 1A:
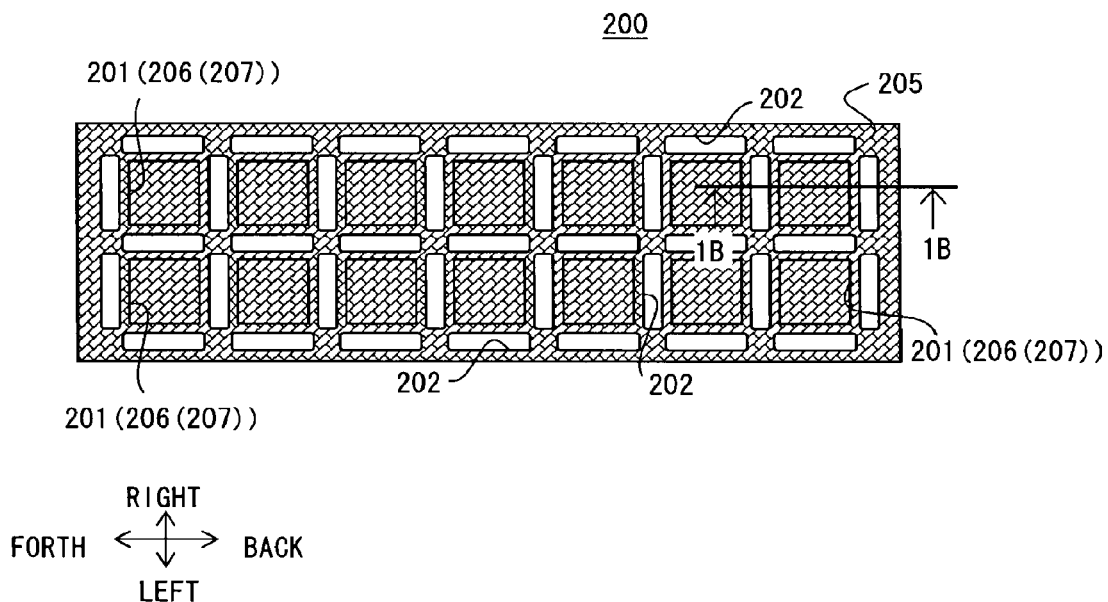
FIG. 1A is a schematic top view showing an example of a heat treatment jig according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the explanation below, components identical are denoted by reference numerals identical with detailed description omitted.

Figure 1B:
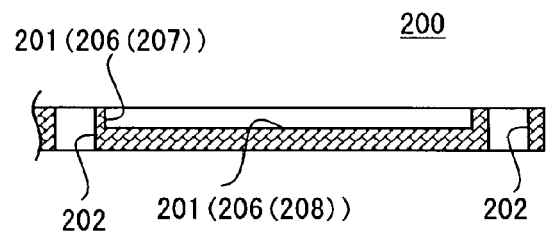
FIG. 1B is a cross sectional diagram showing the cut section taken along the line 1B-1B of FIG. 1A.

FIG. 1A is a schematic top view of a heat treatment jig 200 according to an embodiment of the present invention. FIG. 1B is a cross sectional diagram showing the cut section taken along the line 1B-1B of FIG. 1A. In the explanation hereinafter, for convenience of explanation, back, forth, left, right, top and bottom directions are defined as indicated by the arrows in FIG. 1A. The heat treatment jig 200 shown in FIG. 1A includes a rectangle substrate 205 with its sides in back and forth directions indicated by the arrows in FIG. 1A as long sides. Further, a plurality of holding concave portions 201 for mounting and holding an object (not shown) are formed to the top face of the substrate 205. As the holding concave portions 201 mounts and holds the object 1 individually, the shapes of the holding concave portions 201 correspond to the outer shape of the objects. In the example shown in FIG. 1A, the shape of the bottom portion of the holding concave portions 201 is square. 2×7 of the holding concave portions 201 are formed with two rows in lattice in right and left direction (short side direction) indicated by the arrows in FIG. 1A. The holding concave portion 201 includes an inner wall 206 constituted of a sidewall 207 having four surfaces and a bottom portion 208. A through-hole 202, which is a slit-like void part in line shape, is formed almost parallel to the sidewall 207 near each of the surfaces constituting the four sidewalls 207 of the holding concave portion 201.

Figure 2A:
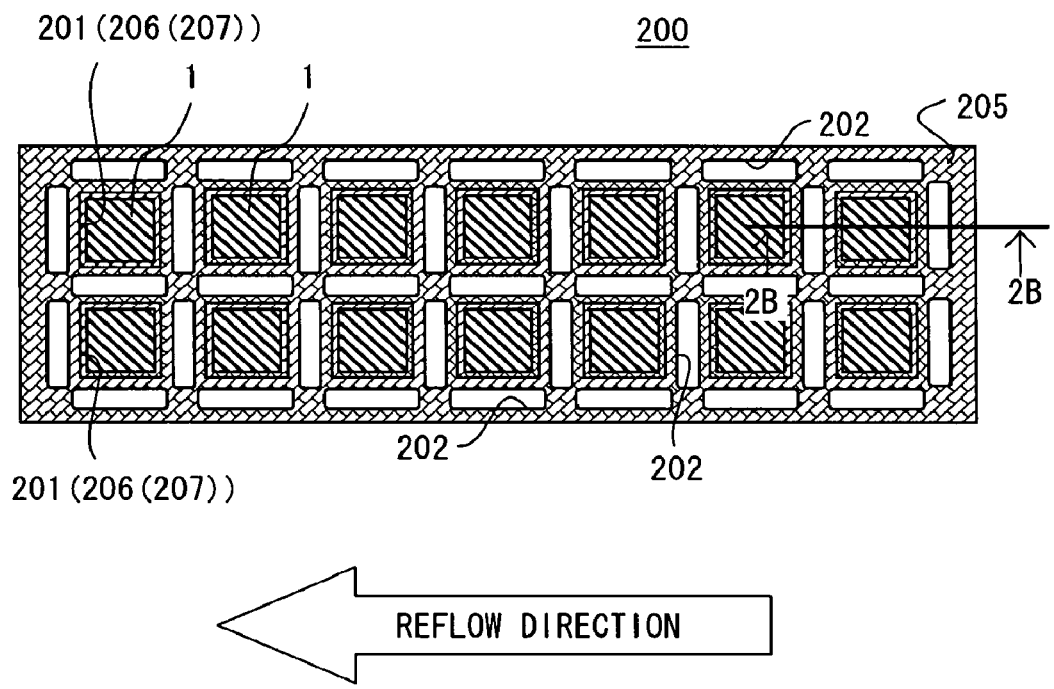
FIG. 2A is a schematic top view showing an example in which an object is mounted to a heat treatment jig.
Figure 2B:
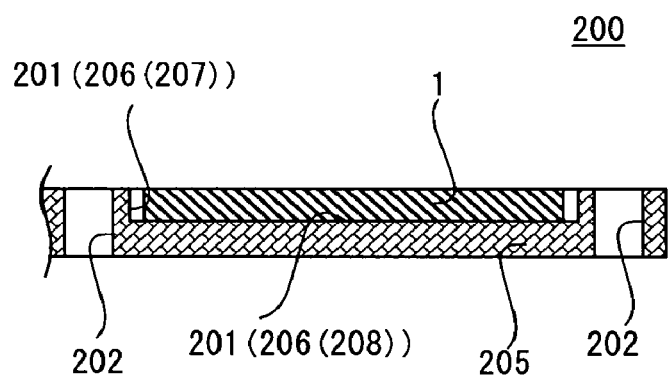
FIG. 2B is a cross sectional diagram showing the cut section taken along the line 2B-2B of FIG. 2A.
Figure 2C:
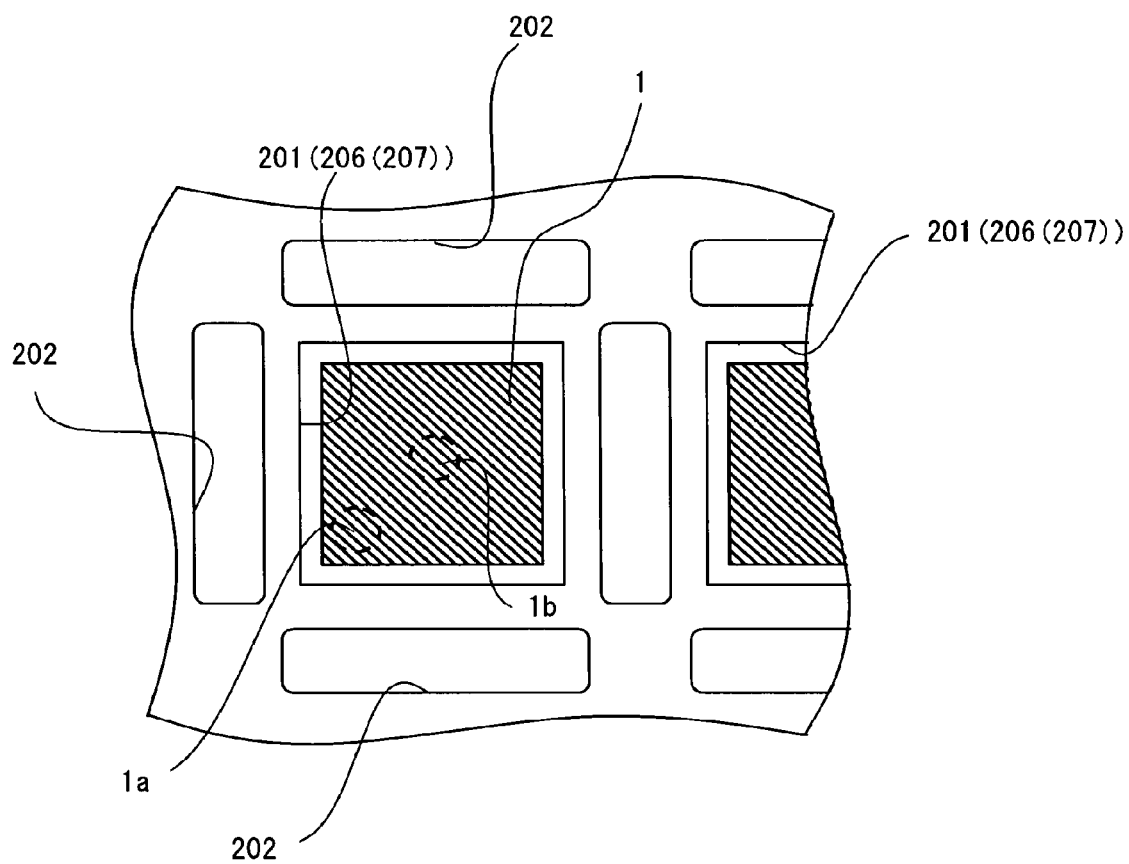
FIG. 2C is a partial enlarged top view showing a holding concave portion of FIG. 2A.

FIG. 2A is a schematic top view of the heat treatment jig 200 in which the object 1 is housed in the holding concave portion 201. FIG. 2B is a cross sectional diagram showing the cut section taken along the line 2B-2B of FIG. 2A. FIG. 2C is a partial enlarged top view of near the holding concave portion 201 shown in FIG. 2A.

The object 1 is for example a semiconductor device having a basic configuration with chip components mounted to the top face of its wiring substrate.

The heat treatment jig 200 is formed from material resistant to a reflow process. For example, SUS steel, aluminum alloy or ceramic may be used. The heat treatment jig 200 is formed to have a board thickness of 3.0 (mm) or less, for example.

When carrying out a reflow process on the object 1 such as a semiconductor device using the heat treatment jig 200 of this embodiment, as shown in FIGS. 2A and 2B, firstly the object 1 is inserted from above into the holding concave portion 201 and held therein.

Then the heat treatment jig 200 holding the object 1 is thrown inside a reflow oven (not shown) to let the heat treatment jig 200 go through in the direction indicated by the arrow saying "reflow direction" in FIG. 2A. By this, a reflow process is performed on the object 1 so that a desired part of the object 1 is jointed (for example jointing chip component with wiring substrate).

The heat treatment jig 200 of this embodiment is formed from metal that is resistant to the temperature at are flow. Therefore, heat capacity of the heat treatment jig itself cannot be ignored. However for the heat treatment jig 200 of this embodiment, the through-holes, which are slit-like void parts in line shape, are formed to the wide part of the substrate 205 the sidewalls of the holding concave portion 201 that holds object 1.

Figure 3:
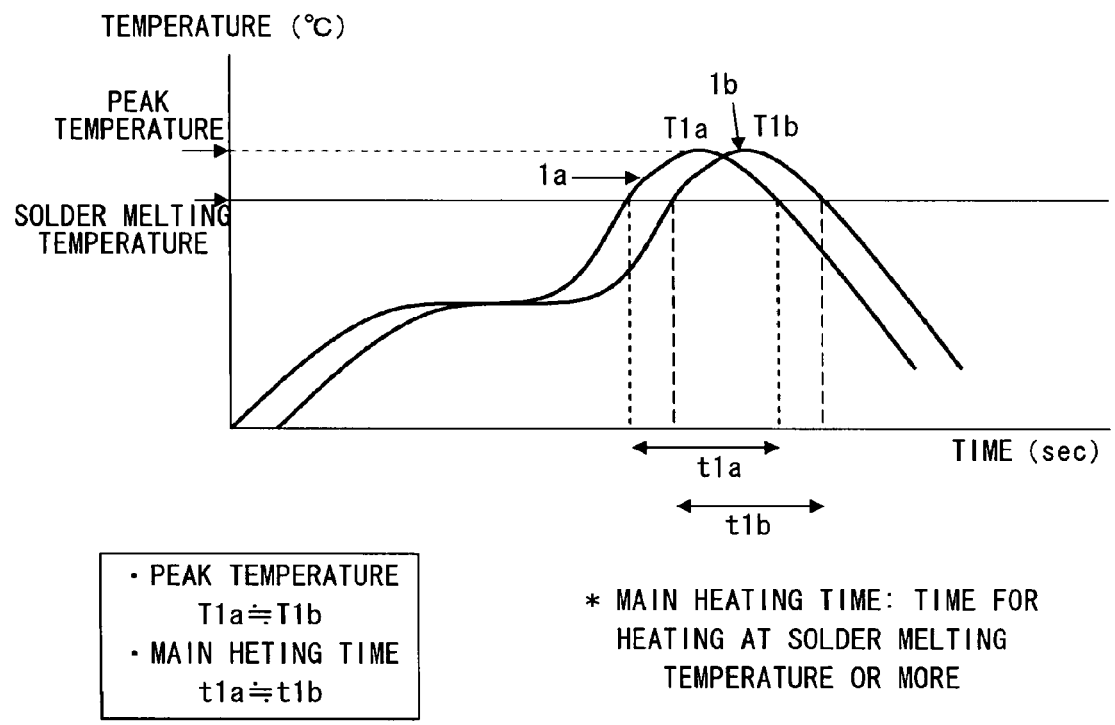
FIG. 3 shows a reflow profile plotting temperatures of a corner and central parts to reflow time of object.

Therefore, parts with a large heat capacity do not lie adjacent to the holding concave portion 201. Further, heat conduction from the object 1 to the substrate 205 is suppressed by the through-holes 202. Here as shown in FIG. 2C, corner part of the object 1 is referred as 1a and central part of the object 1 is referred as 1b. FIG. 3 is a graph plotting temperature profile of these parts to reflow time. For the heat treatment jig 200 of this embodiment, as shown in FIG. 3, same temperature profiles can be obtained for the corner part 1a and central part 1b of the object 1. Specifically, time t1a for the corner part 1a of the object 1 to increase to solder melting temperature or more is equal to time t1b for the central part 1b of the object 1 to increase to the solder melting temperature or more. Further, the peak temperature T1a for the corner part 1a of the object 1 is equal to the peak temperature T1b for the center part 1b of the object 1.

For the heat treatment jig 200 of this embodiment, it is possible to prevent variation (thermal history variation) in reflow profile from generating inside the object as set forth above. Thus the reflow temperature for object such as semiconductor device can be set to minimum. Accordingly the reliability of the object such as semiconductor device that a reflow process has been provided can be improved.

The heat treatment jig 200 of this embodiment holds the object by the holding concave portion 201, not by the pushback configuration disclosed in Japanese Unexamined Patent Application Publication No. 10-284639. Thus as shown in FIGS. 2A and 2B, predetermined space may exist between the sidewalls 207 of the holding concave portion 201 and lateral surface of the object 1. Accordingly, even when performing a reflow process on the heat treatment jig 200 of this embodiment that holds the object 1, no stress is affected to the object 1. Further, as the bottom portion is provided to the holding concave portion 201, the object 1 will not fall.

Furthermore, for the heat treatment jig 200 of this embodiment, the through-holes 202, which are void part, are formed near each of the surfaces constituting the sidewalls 207 of the plurality of holding concave portions 201 that are formed in array. Therefore, heat capacity for adjacent part of the holding concave portion 201 can be reduced. Thus regardless of the position to insert the plurality of holding concave portions 201, same reflow profile for object can be obtained.

Additionally, for the heat treatment jig 200 of this embodiment, slit-like through-holes 202 in line shape are formed almost parallel to each of the surfaces constituting the sidewalls 207 of the rectangle holding concave portions 201. Thus it is possible to eliminate a part having large heat capacity Moreover, since the part corresponding to the outer frame of the holding concave portion 201 is connected to the portion corresponding to the outer frame of the substrate 205 by its four corners, it is possible to secure necessary strength. In other words, through-holes 202 are preferably formed to the heat treatment jig 200 as long and large as possible in a range for securing necessary strength.

Figure 4A:
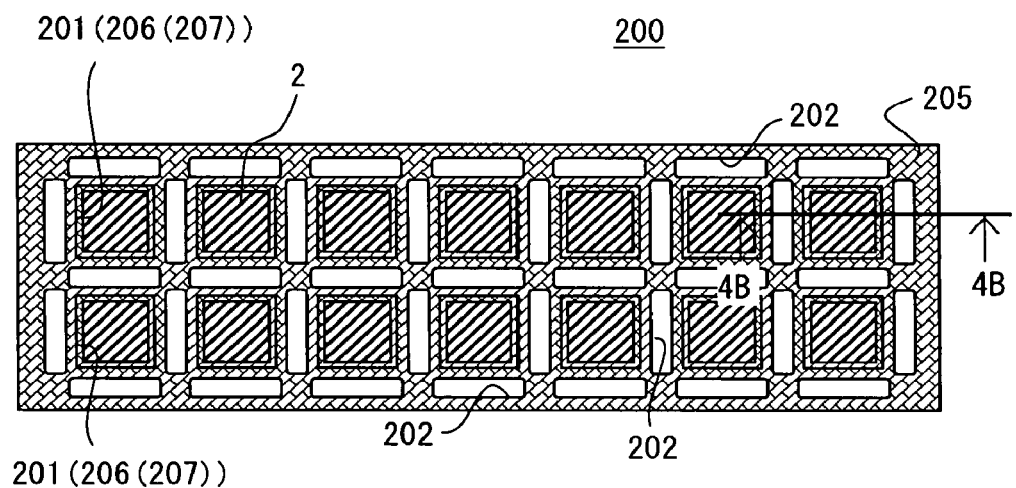
FIG. 4A is a schematic top view of a heat treatment jig holding object having a package-on-package configuration.
Figure 4B:
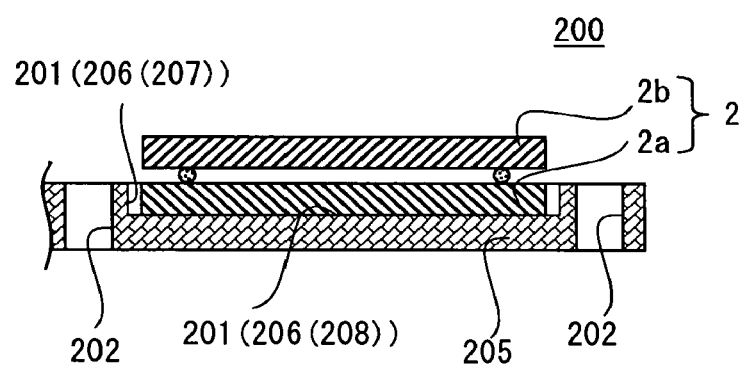
FIG. 4B is a cross sectional diagram showing the cut section taken along the line 4B-4B of FIG. 4A.

As an example of object, it is not limited to the semiconductor device having a basic configuration as set forth above. For example it can be a semiconductor device having package-on-package configuration. FIG. 4A is a schematic top view of the heat treatment jig 200 having an object 2 inserted and held therein, where the object 2 is a semiconductor device having a package-on-package configuration. FIG. 4B is a cross sectional diagram showing the cut section 4B-4B of FIG. 4A. As shown in FIG. 4B, the object 2 includes a bottom package 2a and a top package 2b constituting the semiconductor device having a package-on-package configuration. Firstly, the bottom package 2a of a semiconductor device having a package-on-package configuration is inserted to the holding concave portion 201 and held therein.

After that, the top package 2b is mounted to the bottom package 2a by a mounter or the like. When mounting, an activator such as flux and soldering paste is preferably supplied to the joint. Then a heat treatment is performed to the object 2 that is mounted to the heat treatment jig using a heating apparatus including a reflow oven etc. This makes the bottom package 2a and top package 2b jointed by solder.

In the above embodiment, an example is explained in which two lines of the holding concave portions 201 are formed to the heat treatment jig 200 and the through-holes 202 are formed near each of the surfaces constituting the sidewalls of the holding concave portions 201.

Figure 5:
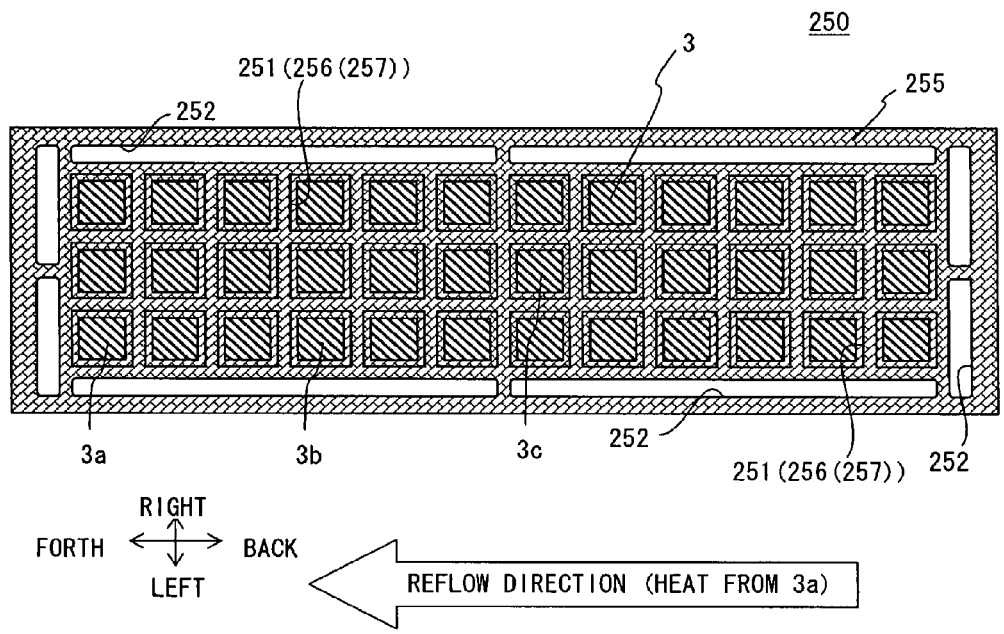
FIG. 5 is a schematic top view of a heat treatment jig and an object mounted thereto according to another embodiment of the present invention.

However various variations are accepted for the shape and arrangement of the heat treatment jig and shape, size and arrangement or the like of the holding concave portion. Hereinafter, another example of an embodiment different from the above embodiment is described. FIG. 5 is a schematic top view of a heat treatment jig 250 and an object 3 held therein according to another embodiment of the present invention. The heat treatment jig 250 includes a rectangle substrate 255 with its back and forth directions indicated by the arrows in the drawing as long sides. Further, a plurality of holding concave portions 251 for mounting and holding the object 3 are formed to the top face of the substrate 255. In the example shown in FIG. 5, 3×7 of the holding concave portions 251 are formed with three rows in lattice in right and left direction (short side direction) indicated by the arrows in FIG. 5.

Further, through-holes 252, which are slit-like void parts in line shape, are formed near and almost parallel to sidewalls 257, where among the four surfaces constituting the sidewalls 257 in inner walls 256 of the plurality of holding concave portions 251, the sidewalls 257 here are not adjacent to other holding concave portions 251. Specifically, the through-holes 252 are formed to the part corresponding to outer frame of the substrate 255. For the heat treatment jig 200 shown in FIG. 1A, the through-holes 202 are provided to each of the holding concave portions 202. However for the heat treatment jig 250 shown in FIG. 5, common slit-like through-holes 252 are formed shared by several adjacent holding concave portions. To be more specific, two of the through-holes 252 are formed to each of the edge parts in back and forth, and two of the through-holes 252 are formed to each of the edge parts in left and right, as indicated by the arrows in FIG. 5. Facing distances between adjacent holding concave portions 251 are shorter than those between the holding concave portions 201 formed to the heat treatment jig 200 shown in FIG. 1. The object 3 is mounted to the holding concave portion 251 and a reflow process is performed in the similar way as set forth above, for example.

As for the heat treatment jig 250, distances between the adjacent holding concave portions are narrower as compared to the heat treatment jig 200 described above. Thus the heat capacity in the area can be reduced even without providing the through-holes 252 between the adjacent holding concave portions. In the peripheral part not adjacent by the holding concave portion, the through-holes 252 are formed as set forth above. Therefore, it is possible to reduce the heat capacity of the substrate 255. Thus it is possible to reduce the thermal history variation depending on the position of the object 3.

Figure 6:
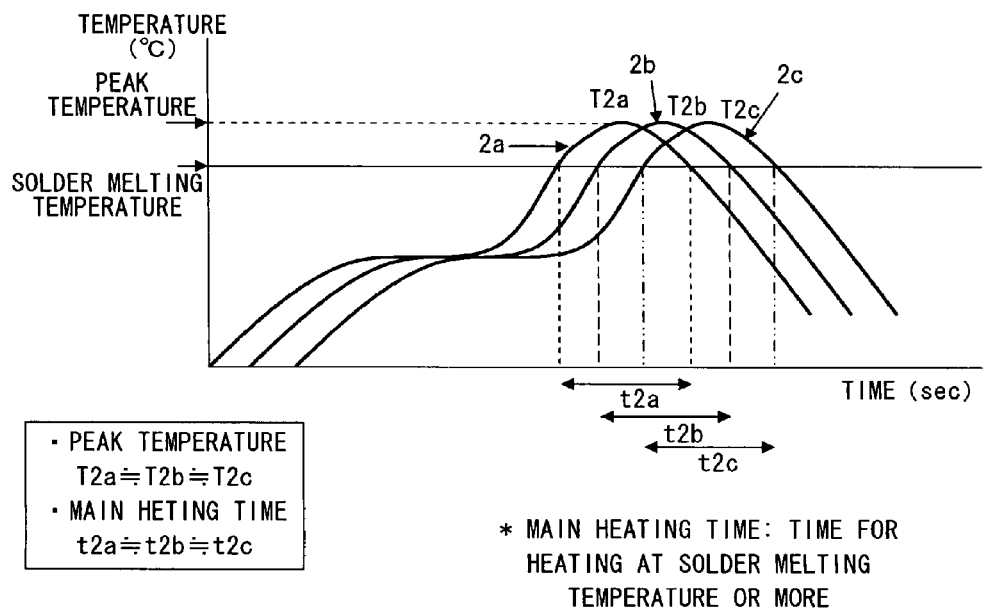
FIG. 6 shows reflow profile plotting a temperatures of an object to reflow time of object.

Here, for the object 3 mounted to the heat treatment jig 250, as shown in FIG. 5, the object 3 placed to the edge lines in both the right and left and back and forth directions as indicated by the arrows in FIG. 5 are referred to as a first object 3a, similarly the object 3 placed to the edge lines in either the right and left or back and forth direction is referred to as a second object 3b. Likewise, the object 3 placed to inner lines in both the right and left and back and forth directions are referred to as a third object 3c. FIG. 6 shows temperature profile to reflow time for each of the first object 3a, second object 3 and third object 3c when the heat treatment jig 250 is thrown into a reflow oven. By using the heat treatment jig 250, temperature profiles for each of the first object 3a, second object 3b and third object 3c can be same as shown in FIG. 6. Specifically, heating time t2a of the first object 3a, heating time t2b for the second object 3b and heating time t2c for the third object 3c exceeding the solder melting temperature can be same. Further, temperature profiles of peak temperature T2a for the first object 3a, peak temperature T2b for the second object 3b and peak temperature T2c for the third object 3c can be same. Thus the thermal history variation (variation in reflow profiles) between object depending on the position of the plurality of holding concave portions provided to the heat treatment jig 250 can be same.

For the heat treatment jig 250, it is possible to prevent the variation in reflow profile for the plurality of objects to hold. Thus the reflow temperature can be set to minimum. Accordingly the reliability of the object such as semiconductor device that a reflow process has been provided can be improved.

Figure 7A:
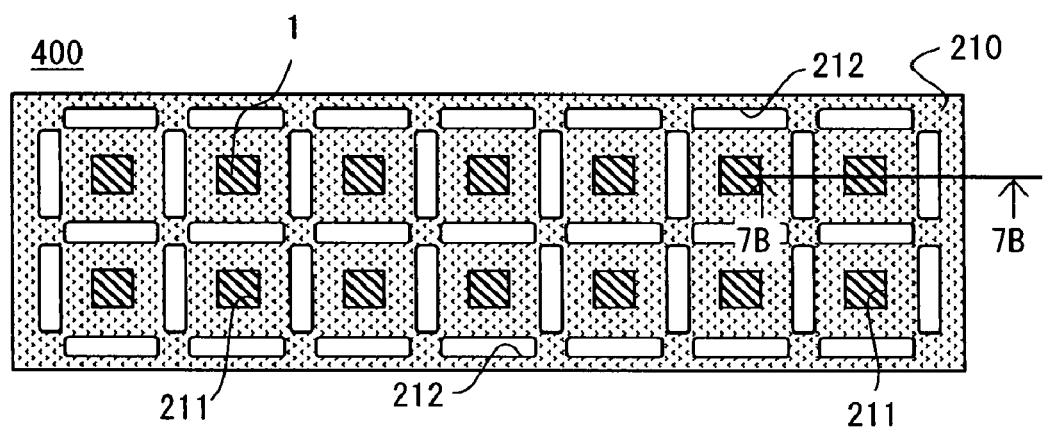
FIG. 7A is a schematic top view showing a heat treatment jig set having a jig cover mounted to the heat treatment jig of FIG. 1.
Figure 7B:
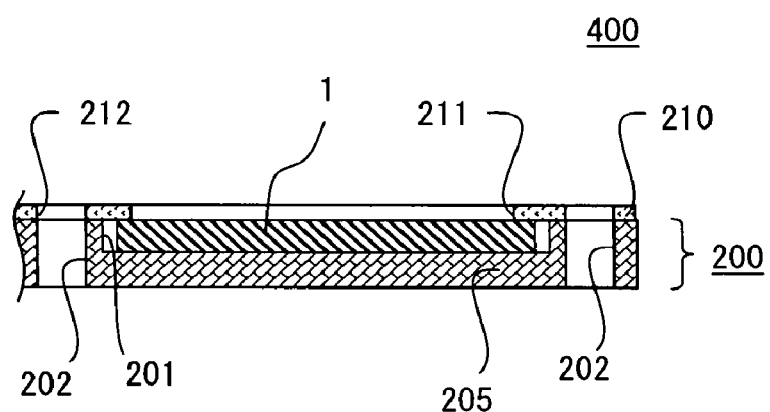
FIG. 7B is a cross sectional diagram showing the cut section taken along the line 7B-7B of FIG. 7A.

A detachable jig cover may be mounted over the heat treatment jig. FIG. 7A is a schematic top view of a heat treatment jig set 400 having a jig cover 210 mounted to the heat treatment jig 200. FIG. 7B is a cross sectional diagram showing the cut section taken along the line 7B-7B of FIG. 7A.

The jig cover 210 is formed to be flat having almost same shape as the substrate 205 of the heat treatment jig 200. For the jig cover 210, rectangle apertures 211 are formed to the position corresponding to where the holding concave portions 201 of the heat treatment jig 200 are formed. An aperture area of the aperture 211 is smaller than that of the holding concave portion 201. Holes 212, which are openings, are formed to the position corresponding to the through-holes 202 provided to the substrate 205 of the heat treatment jig 200. As shown in FIG. 7B, firstly the object 1 is mounted to the holding concave portion 201 of the heat treatment jig 200 and held therein. Then the jig cover 210 is mounted to the top face of the heat treatment jig 200 so as to hold the object 1 from the top face thereof. After that, a reflow process is performed by the similar method as above.

Since the jig cover 210 is used for the heat treatment jig set 400, the object 1 can be held in a more definitive way. As the apertures 211 are provided to the opening of the holding concave portion 201, central area of the object 1 is exposed. Accordingly even if an object to have a reflow process performed such as a chip component (not shown) is placed in the central area of the top face of the object 1, the reflow process is not influenced by the jig cover 210.

The jig cover 210 holds the peripheral part of the top face of the object 1. Further, for the jig cover 210, as the holes 212, which are openings, are formed to the position corresponding to the through-holes 202 provided to the substrate 205 of the heat treatment jig 200, it is possible to prevent from a part (wide part) having a large heat capacity for the jig cover 210 in the peripheral part of the top face of the object 1.

Thus, heat conduction from the object 1 to the jig cover 210 can be suppressed by the holes 212. Therefore, it is possible to prevent from variations in reflow profile (thermal history variation) depending on the positions of the object is as well as the variation in reflow profile (thermal history variation) between the object 1s depending on the positions of the holding concave portions. Further, an example is described in which the jig cover 210 holds the peripheral part of the top face of the object, however the part to hold is not limited to this.

Figure 8A:
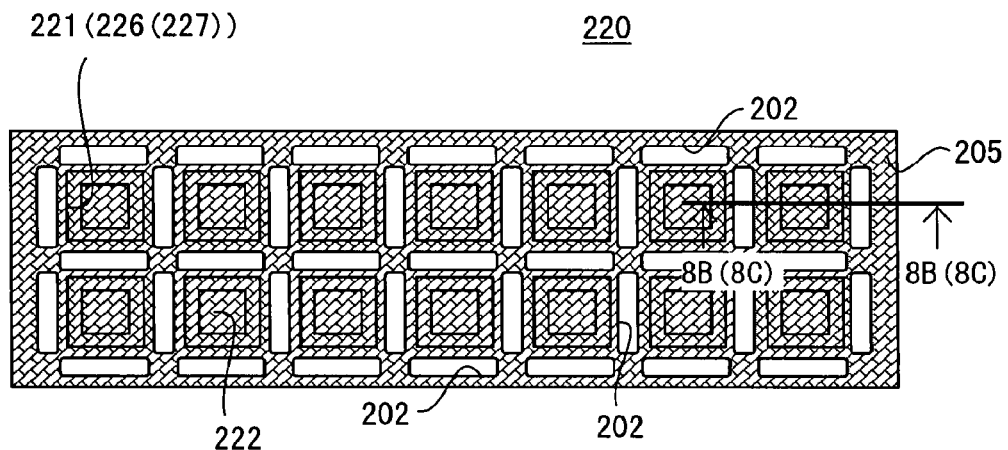
FIG. 8A is a schematic top view of a heat treatment jig according to another embodiment of the present invention.
Figure 8B:
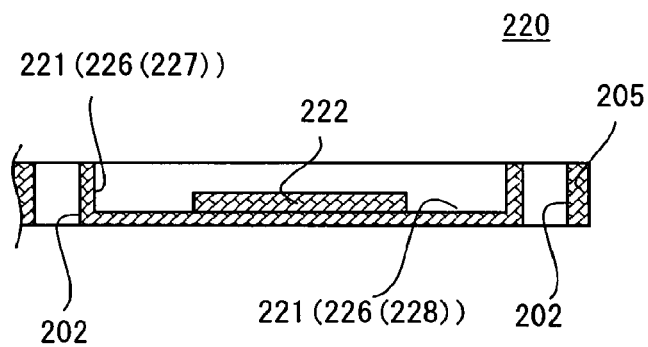
FIG. 8B is a cross sectional diagram showing the cut section taken along the line 8B-8B of FIG. 8A.
Figure 8C:
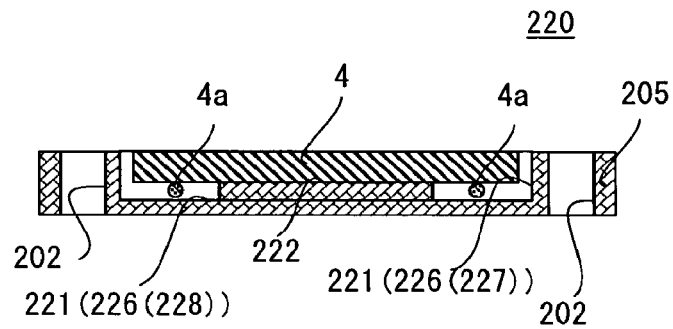
FIG. 8C is a cross sectional diagram showing the cut section taken along the line 8C-8C of FIG. 8A when mounting an object to a holding concave portion of FIG. 8A.

In the above embodiment, an example is described in which the bottom portion of the holding concave portion is flat, it is not limited to this but a supporting bump portion may be formed therein. FIG. 8A is a schematic top view of a heat treatment jig 220 having a supporting convex portion as a supporting bump portion formed to the central part of the bottom portion of the holding concave portion. FIG. 8B is a cross sectional diagram showing the cut section taken along the line 8B-8B of FIG. 8A. FIG. 8C is a cross sectional diagram showing the cut section taken along the line 8C-8C when an object 4 is mounted to the holding concave portion 202 of FIG. 8A. For the heat treatment jig 220, the through-holes 202 are formed corresponding to the position near sidewalls 227 among inner walls 226 of the holding concave portions 221 and also the position almost parallel to the sidewall faces.

The object 4 is for example a semiconductor device having a flip-chip bonding or package-on-package configuration with solder balls 4a in the peripheral part of the bottom face (see FIG. 8C). As the supporting convex portion 222 is provided to the bottom portion 228 of the holding concave portion 221 for the heat treatment jig 220, center of the bottom face of the object 4 can be supported by the supporting convex portion 222 without buffering the solder balls 4a.

Figure 9A:
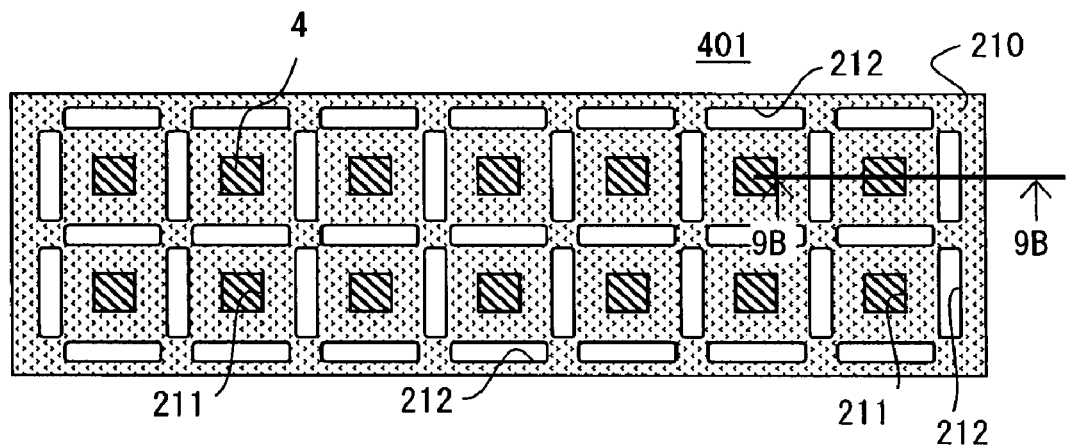
FIG. 9A is a schematic top view showing a heat treatment jig set having a jig cover mounted to the heat treatment jig of FIG. 8A.
Figure 9B:
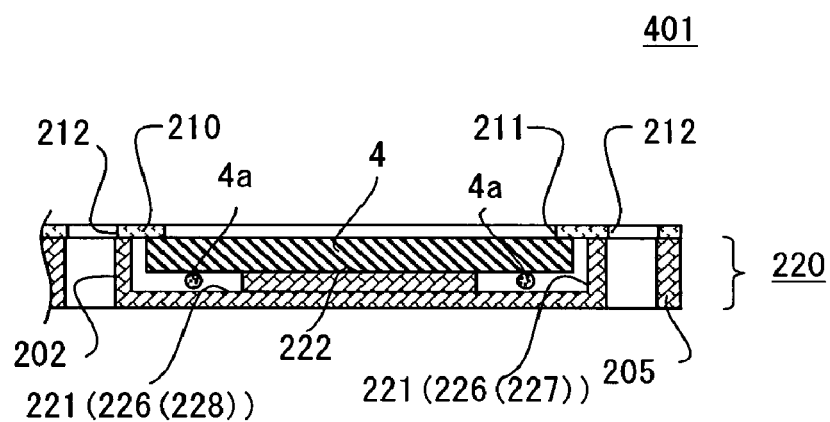
FIG. 9B is a cross sectional diagram showing the cut section taken along the line 9B-9B of FIG. 9A.

Thus it is possible to prevent from variations in reflow profile inside the object 4 as well as variation in reflow profile between object depending on the position of the inserted holding concave portion. FIG. 9A is a schematic top view of a heat treatment jig set 401 having the jig cover 210 mounted to the heat treatment jig 220. FIG. 9B is a cross sectional diagram showing the cut section taken along the line 9B-9B of FIG. 9A. As shown in FIGS. 9A and 9B, the detachable jig cover 210 may be mounted to the heat treatment jig 220.

Figure 10A:
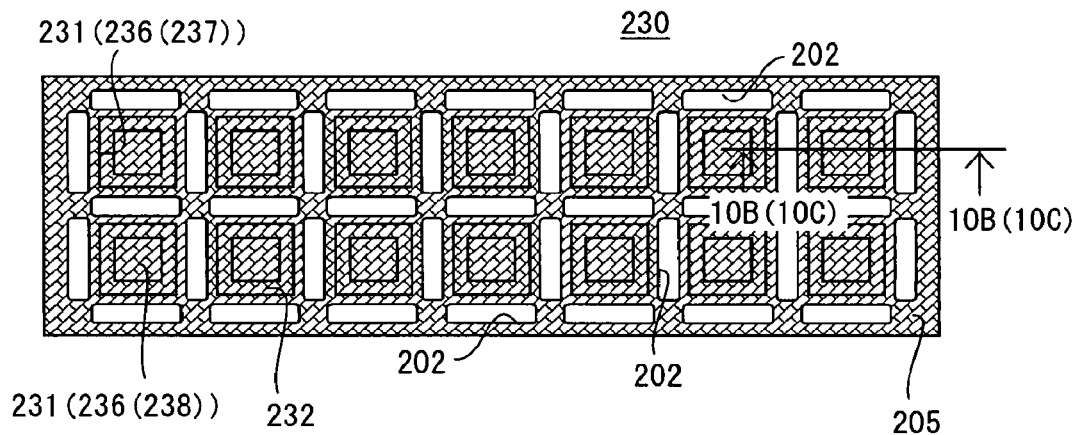
FIG. 10A is a schematic top view of a heat treatment jig according to another embodiment of the present invention.
Figure 10B:
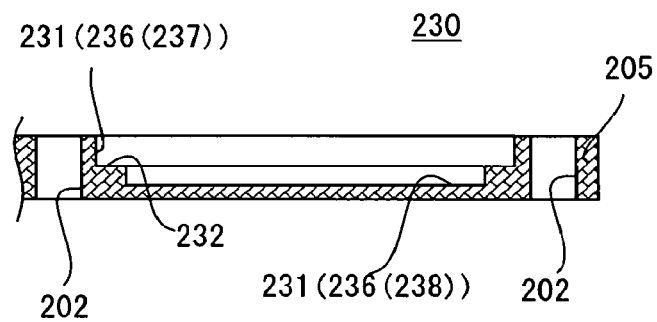
FIG. 10B is a cross sectional diagram showing the cut section taken along the line 10B-10B of FIG. 10A.
Figure 10C:
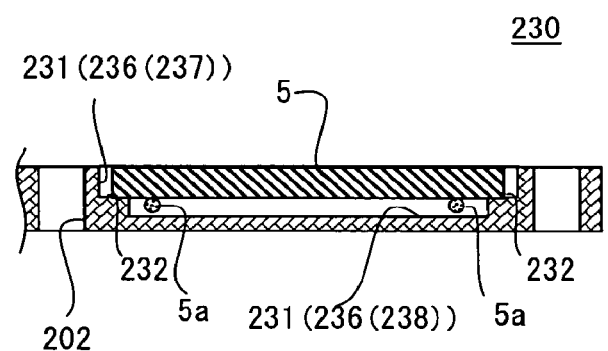
FIG. 10C is across sectional diagram showing the cut section taken along the line 10C-10C of FIG. 10A when mounting an object to a holding concave portion of FIG. 10A.

FIG. 10A is a schematic top view of a heat treatment jig 230 according to another embodiment. FIG. 10B is a cross sectional diagram showing the cut section taken along the line 10B-10B of FIG. 10A. FIG. 10C is a cross sectional diagram showing the cut section taken along the line 10B-10B when mounting object 5 to holding concave portions 231 of FIG. 10A. For the heat treatment jig 230, the through-holes 202 are formed to the position near sidewalls 237 among the inner walls 236 of the holding concave portions 231 and also the position almost parallel to the lines of rectangles. Further, supporting bump portions 232 are formed in the peripheral area of bottom portion 238 among the inner wall 236 of the holding concave portions 231.

The object 5 is for example a semiconductor device having a flip-chip bonding configuration or the like with solder balls 5a in the bottom face of the semiconductor device (see FIG. 10C) As the supporting bump portion 232 is provided, peripheral part of the bottom face of the object 5 can be supported by the supporting bump portion 232 without buffering the solder balls 5a.

Figure 11A:
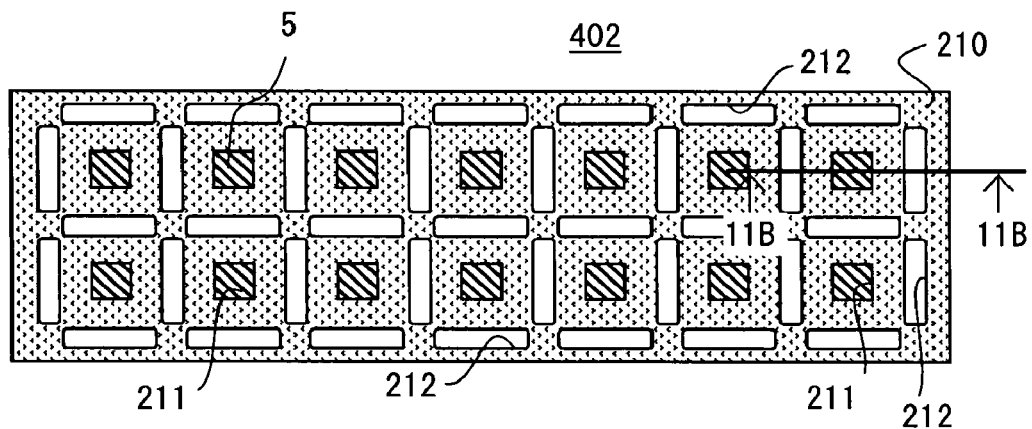
FIG. 11A is a schematic top view showing a heat treatment jig set having a jig cover mounted to the heat treatment jig of FIG. 10A.
Figure 11B:
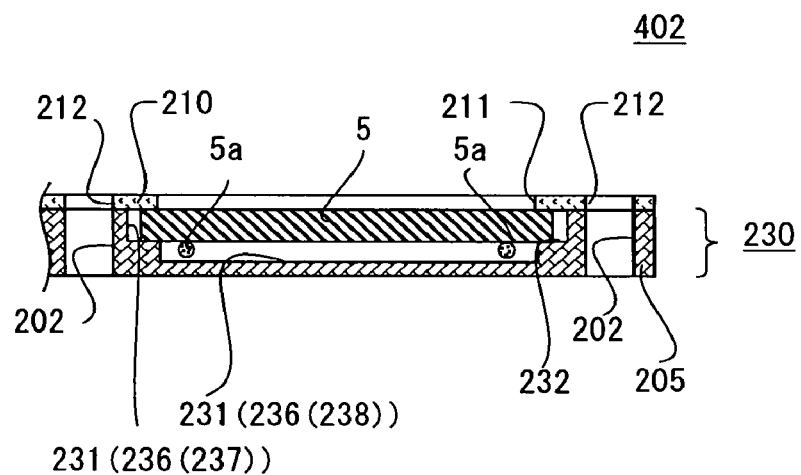
FIG. 11B is a cross sectional diagram showing the cut section taken along the line 11B-11B of FIG. 11A.

Thus it is possible to prevent from variations in reflow profile inside the object 5 as well as variation in reflow profile between object 5 depending on the position of the holding concave portion 232. Note that as shown in FIGS. 11A and 11B, the heat treatment jig set 401 may be formed by mounting the jig cover 210 to the heat treatment jig 230.

Figure 12A:
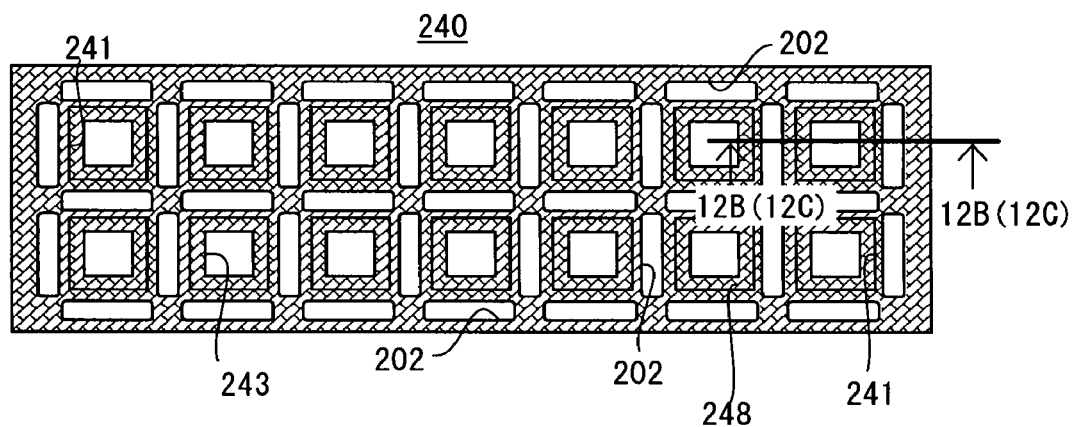
FIG. 12A is a schematic top view of a heat treatment jig according to another embodiment of the present invention.
Figure 12B:
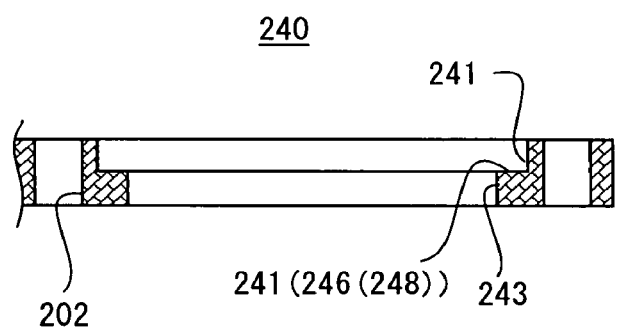
FIG. 12B is a cross sectional diagram showing the cut section taken along the line 12B-12B of FIG. 12A.
Figure 12C:
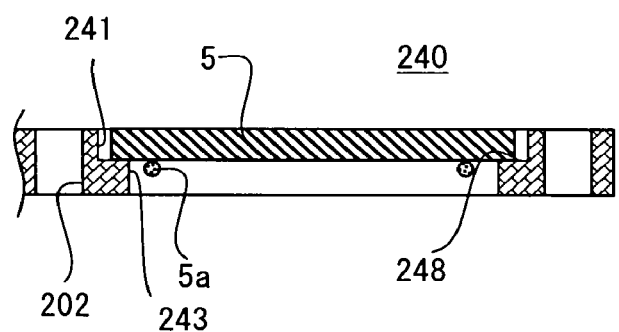
FIG. 12C is a cross sectional diagram showing the cut section taken along the line 12C-12C of FIG. 12A when mounting an object to a holding concave portion of FIG. 12A.

FIG. 12A is a schematic top view of a heat treatment jig 240 according to another embodiment. FIG. 12B is a cross sectional diagram showing the cut section taken along the line 12B-12B of FIG. 12A. FIG. 12C is a cross sectional diagram showing the cut section taken along the line 12B-12B when mounting an object 5 to a holding concave portion 241 of FIG. 12A. In the heat treatment jig 240 as shown in FIG. 12B, inner part than the peripheral part of a bottom portion 248 constituting an inner wall 246 of the holding concave portion 241 is to be apertures 243, which are openings. The number and shape of the through-holes 202 for the heat treatment jig 240 are identical to the above heat treatment jig. Thus the explanation will not be repeated here.

As shown in FIG. 12C, for the heat treatment jig 240, the bottom portion 248 is provided only to part where the solder balls 5a are not formed, which is the peripheral part of the bottom face of the object 5, and other parts are the apertures 243. Thus the object 5 can be supported without buffering the solder balls 5a. Further, as with the jig cover of FIGS. 9A and 9B, a jig cover may be mounted to the top face of the heat treatment jig 240. For the heat treatment jig 240, as the apertures 243, which are openings, are formed to the bottom portion of the holding concave portions 241, heat capacity thereof can be reduced.

Figure 13A:
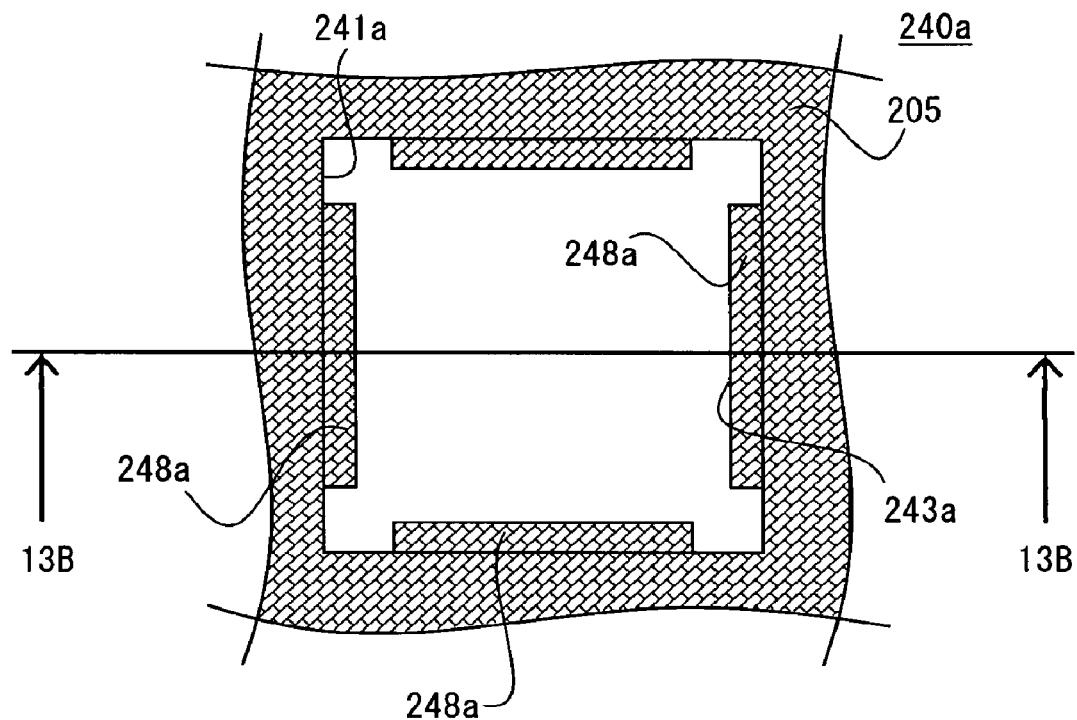
FIG. 13A is a partial enlarged top view showing a holding concave portion of a heat treatment jig according to another embodiment of the present invention.
Figure 13B:
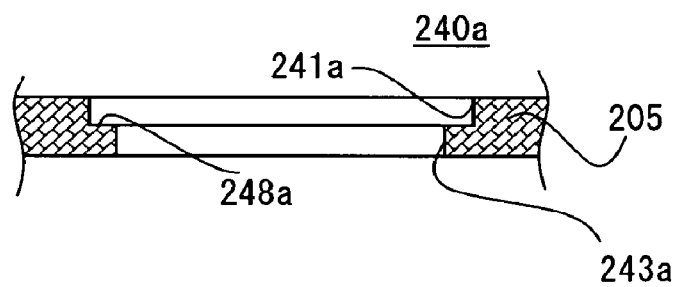
FIG. 13B is a cross sectional diagram showing the cut section taken along the line 13B-13B of FIG. 13A.
Figure 14:
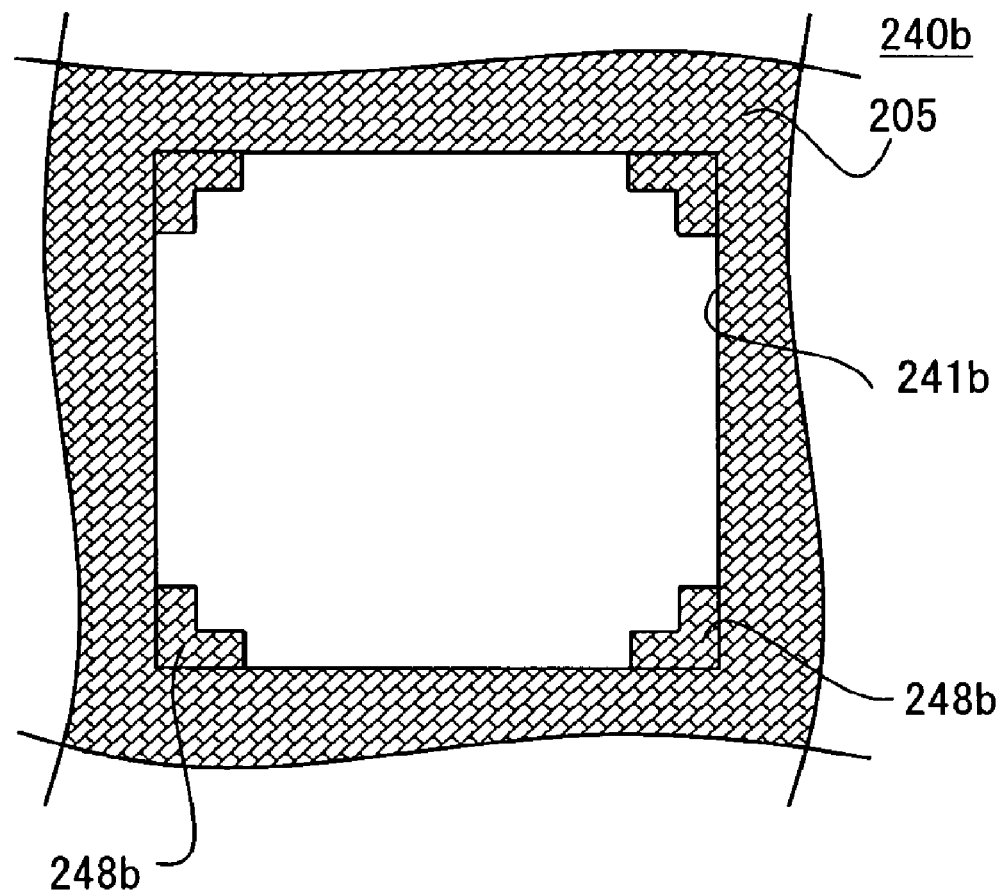
FIG. 14 is a partial enlarged top view showing a holding concave portion of a heat treatment jig according to another embodiment of the present invention.

The shapes of the bottom portion 248 of the holding concave portion 241 and aperture 243 may be modified in various ways. An example of a modification for the bottom portion of the holding concave portion is illustrated hereinafter. FIG. 13A is a partial enlarged top view of a holding concave portion 241a provided to a heat treatment jig 240a. FIG. 13B is a cross sectional diagram showing the cut section taken along the line 13B-13B of FIG. 13A. As shown in FIGS. 13A and 13B, a bottom portion 248a constituting inner wall of the holding concave portion 241a has its corners being cut as compared to the bottom portion 248 of the heat treatment jig 240 shown in FIG. 12A. FIG. 14 is a partial enlarged top view of a holding concave portion 241b provided to a heat treatment jig 240b. On the contrary, a bottom portion 248b of the holding concave portion 241b has corners left and other parts being cut.

Figure 15A:
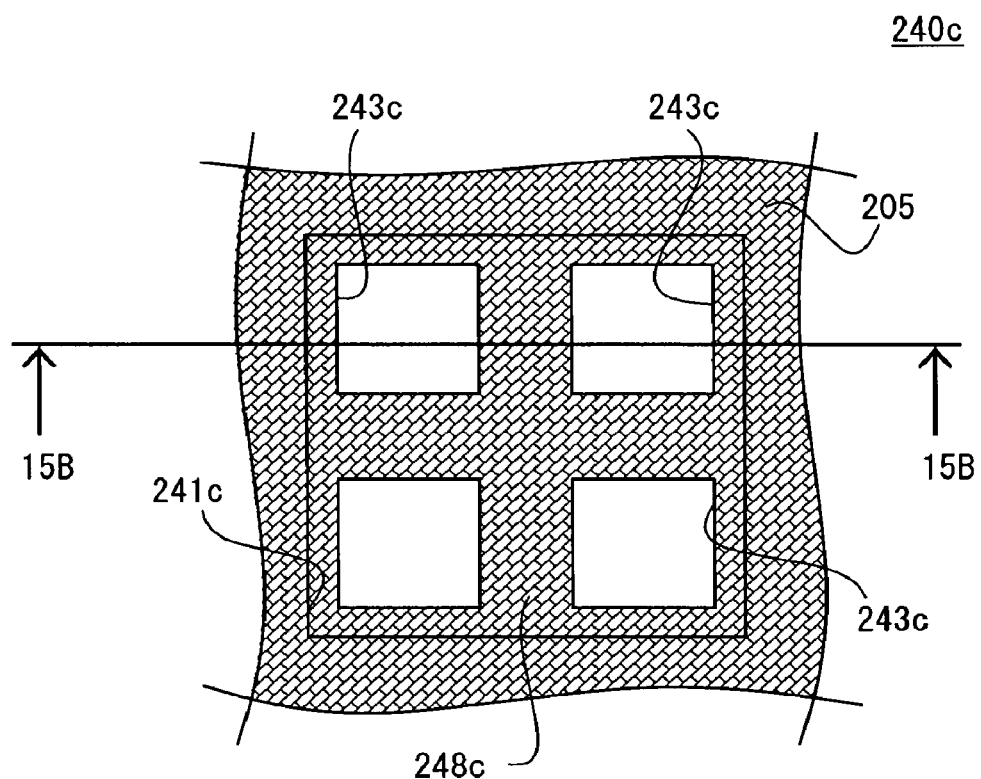
FIG. 15A is a partial enlarged top view showing a holding concave portion of a heat treatment jig according to another embodiment of the present invention.
Figure 15B:
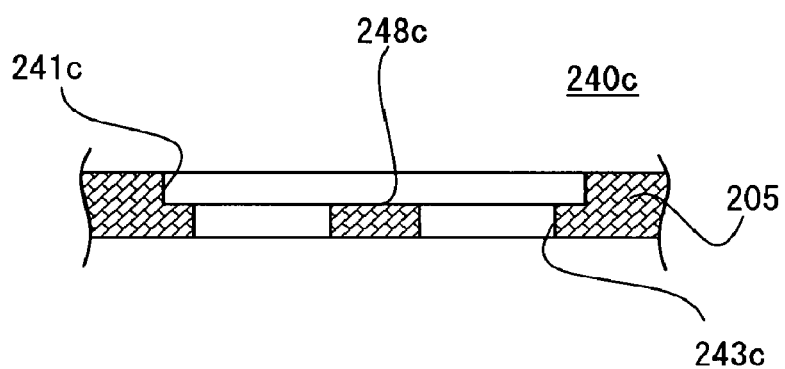
FIG. 15B is a cross sectional diagram showing the cut section taken along the line 15B-15B of FIG. 15A.
Figure 16A:
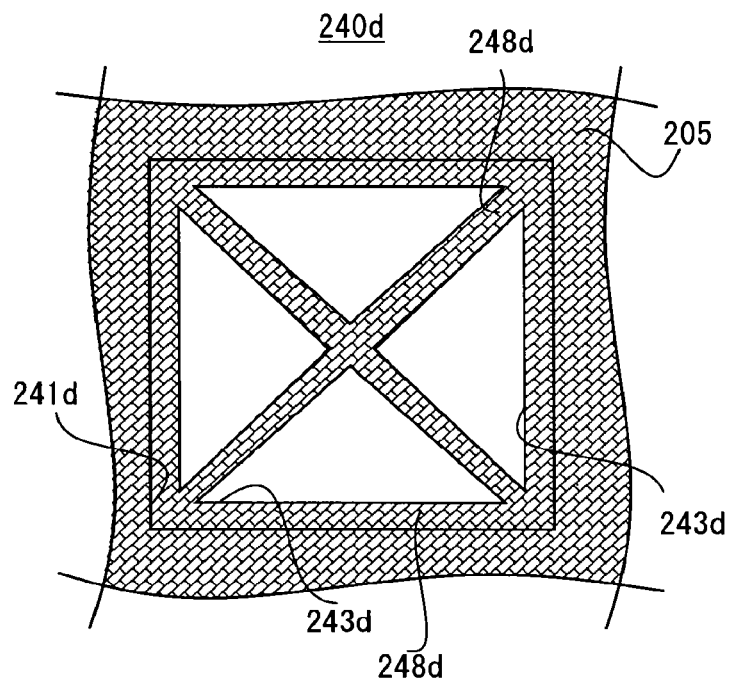
FIG. 16A is a partial enlarged top view showing a holding concave portion of a heat treatment jig according to another embodiment of the present invention.
Figure 16B:
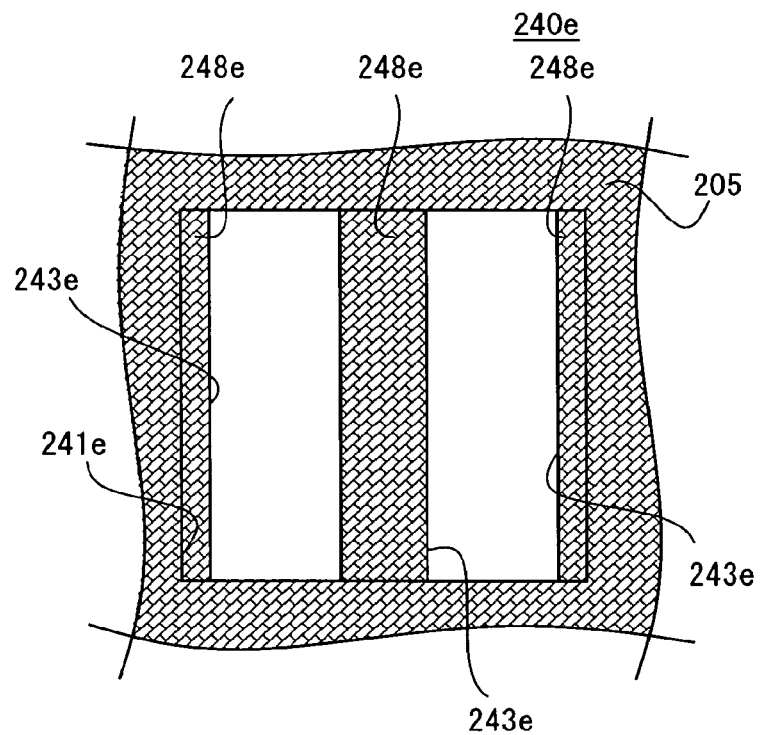
FIG. 16B is a partial enlarged top view showing a holding concave portion of a heat treatment jig according to another embodiment of the present invention.
Figure 17A:
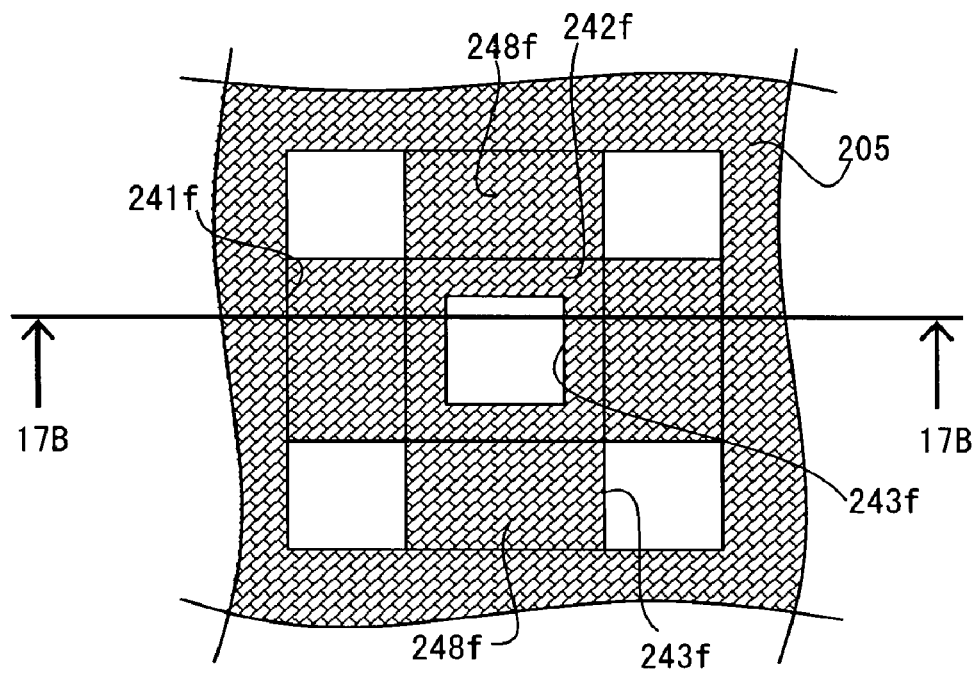
FIG. 17A is a partial enlarged top view showing a holding concave portion of a heat treatment jig according to another embodiment of the present invention.
Figure 17B:
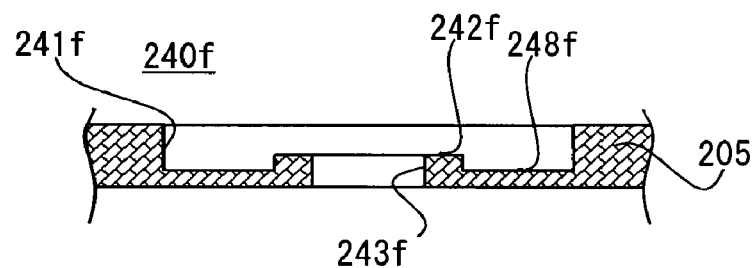
FIG. 17B is a cross sectional diagram showing the cut section taken along the line 17B-17B of FIG. 17A.
Figure 18A:
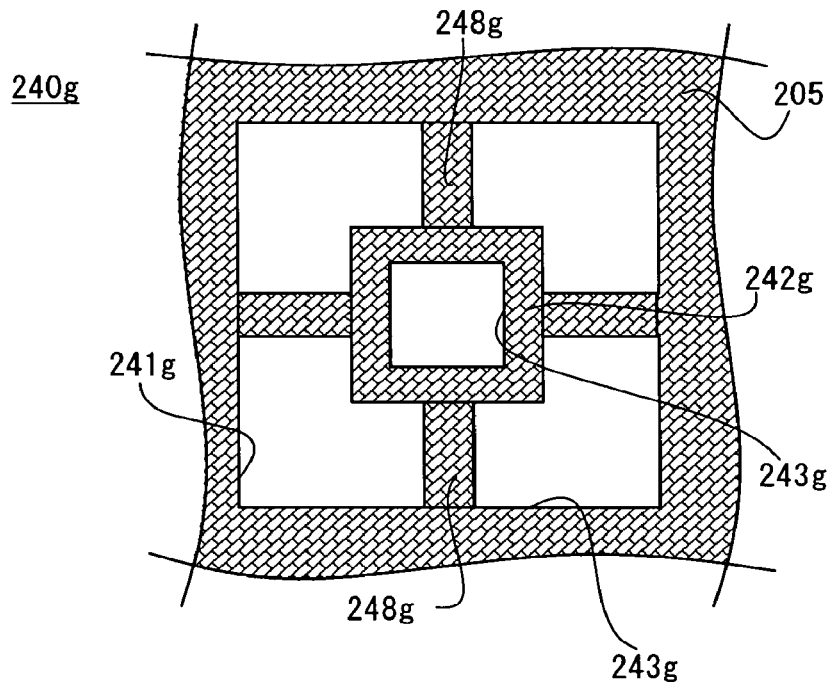
FIG. 18A is a partial enlarged top view showing a holding concave portion of a heat treatment jig according to another embodiment of the present invention.
Figure 18B:
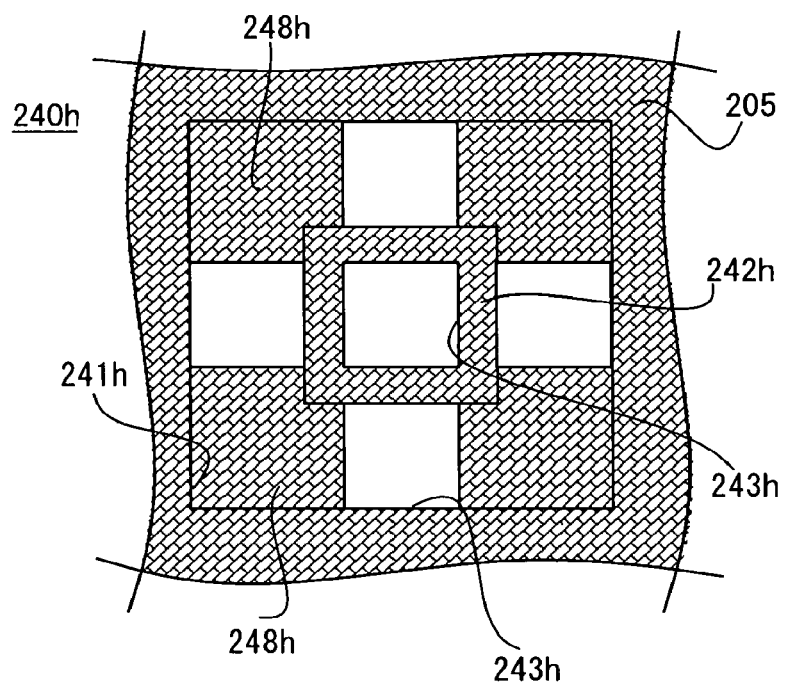
FIG. 18B is a partial enlarged top view showing a holding concave portion of a heat treatment jig according to another embodiment of the present invention.
Figure 18C:
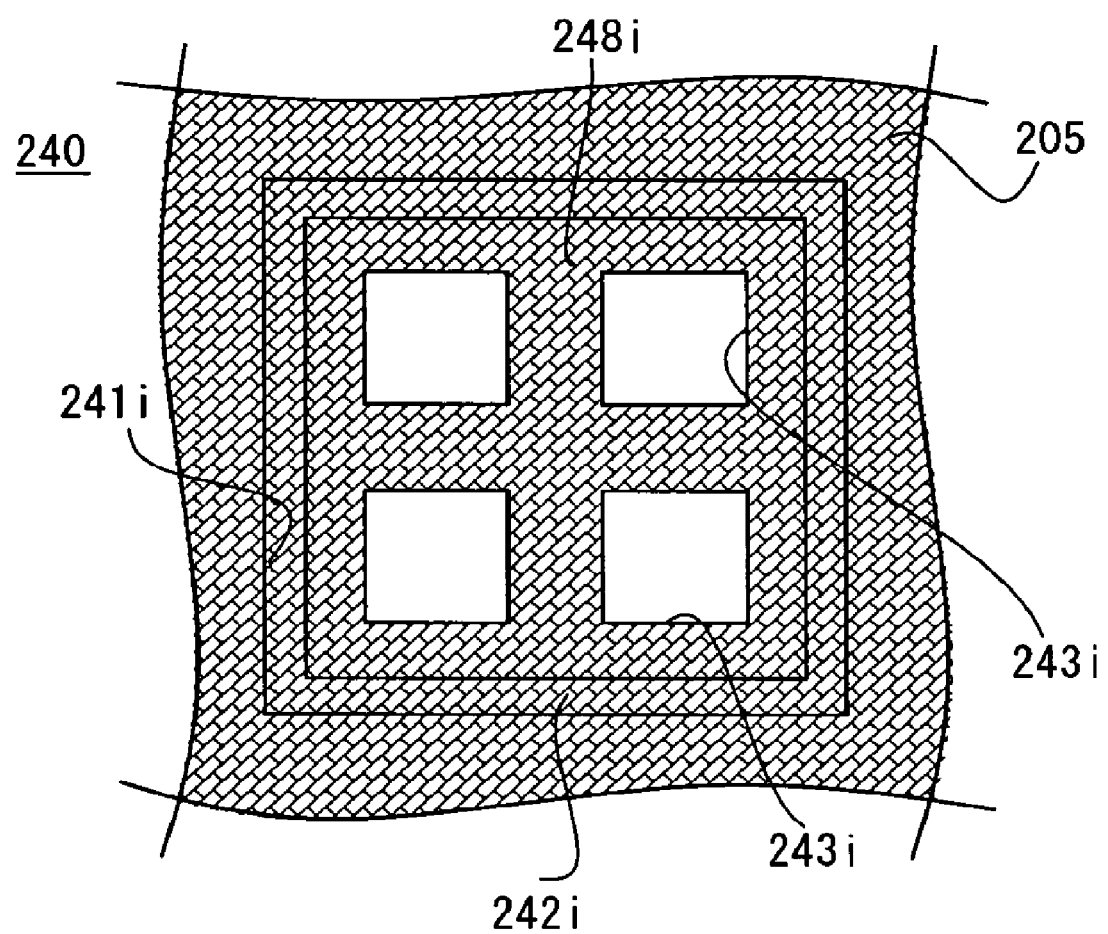
FIG. 18C is a partial enlarged top view showing a holding concave portion of a heat treatment jig according to another embodiment of the present invention.
Figure 18D:
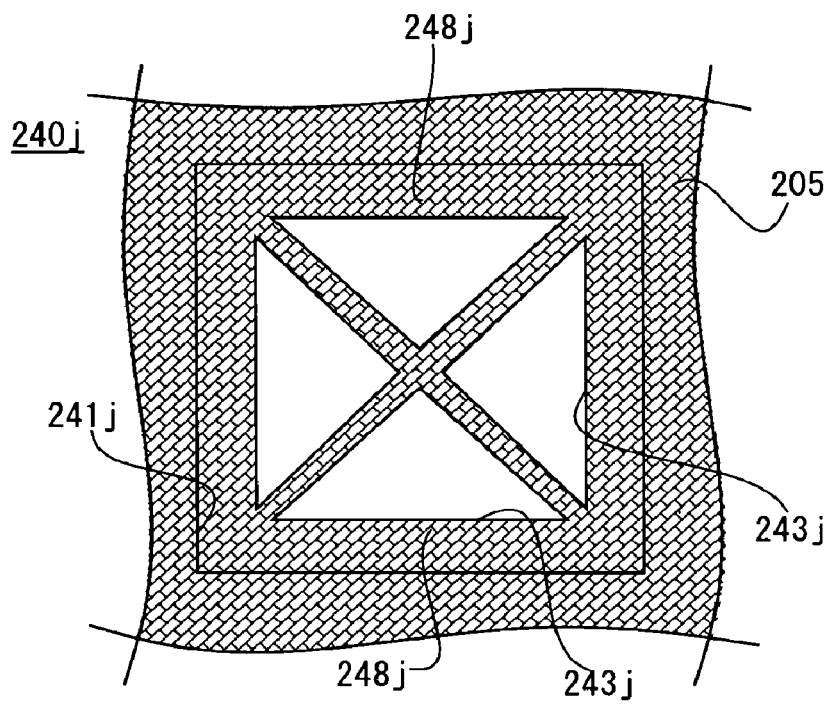
FIG. 18D is a partial enlarged top view showing a holding concave portion of a heat treatment jig according to another embodiment of the present invention.
Figure 18E:
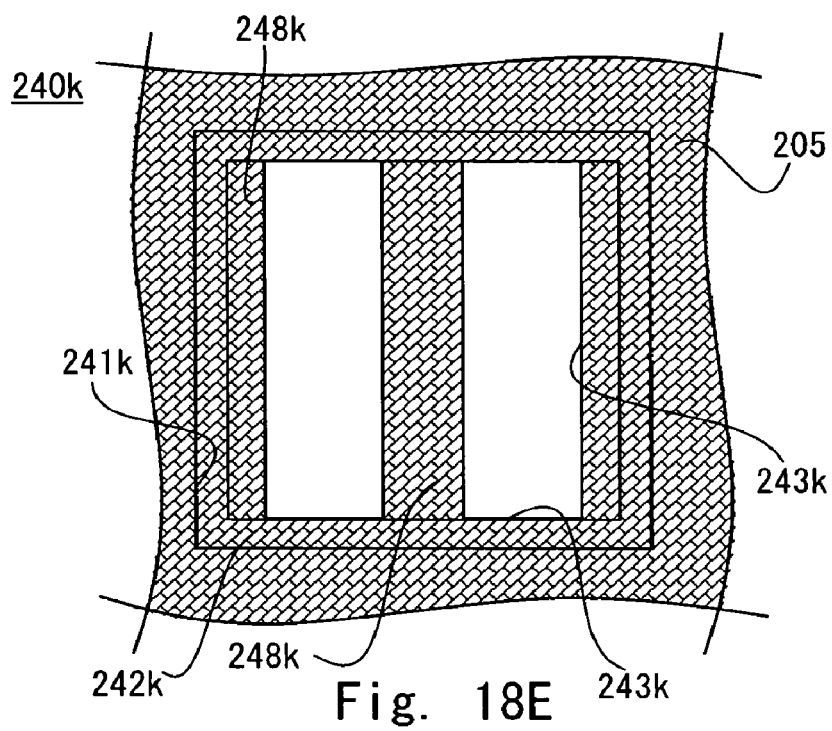
FIG. 18E is a partial enlarged top view showing a holding concave portion of a heat treatment jig according to another embodiment of the present invention.

FIG. 15A is a partial enlarged top view of a holding concave portion 241c provided to a heat treatment jig 240c. FIG. 15B is a cross sectional diagram showing the cut section taken along the line 15B-15B of FIG. 15A. As shown in FIGS. 15A and 15B, 2×2 of apertures 243c vertically and horizontally are provided to a bottom portion 248c of a holding concave portion 241c of a heat treatment jig 240c. FIG. 16A is a partial enlarged top view of a holding concave portion 241d provided to the substrate 205 of a heat treatment jig 240d. FIG. 16B is a partial enlarged top view of a holding concave portion 241e provided to a heat treatment jig 240e. As shown in FIG. 16A, for a bottom portion 248d of the holding concave portion 241*d*, peripheral parts and diagonal lines to the peripheral parts are remained as the bottom portion 248*d* and other parts are being cut to form apertures 243*d* Specifically as shown in FIG. 16A, four triangular apertures 243*d* are formed. As shown in FIG. 16B, for a bottom portion 248*e* of a holding concave portion 241*a*, one side edge part, a facing edge part thereof and an area facing in parallel to the edge parts are remained as the bottom portion 248*e* and other parts are being cut to form apertures 243*e*. FIG. 17A is a partial enlarged top view of a holding concave portion 241*f* provided to a heat treatment jig 240*f*. FIG. 17B is a cross sectional diagram showing the cut section taken along the line 17B-17B of FIG. 17A. For a holding concave portion 241*f*, a rectangle supporting bump portion 242*f* is provided to a central part of a bottom portion 245*f*. Further, for the supporting convex portion 242*f*, which is a rectangle supporting bump portion, same shape but one size smaller apertures 243*f* are provided. Further, almost square apertures 243*f* are provided to the corner parts of the bottom portion 248*f* (see FIGS. 17A and 17B). FIGS. 18A to 18E are partial enlarged top views of holding concave portions (241*g*, 241*h*, 241*i*, 241*j* and 241*k* in order) provided to heat treatment jigs (240*g*, 240*h*, 240*i*, 240*j* and 240*k* in order). For each of the holding concave portions, supporting bump portions (242*g*, 242*h*, 242*i*, 242*j* and 242*k* in order) are provided to bottom portions (248*g*, 248*h*, 248*i*, 248*j* and 248*k* in order) as shown in each of the drawings. Further, apertures (243*g*, 243*h*, 243*i*, 243*j* and 243*k* in order) are provided to the supporting bump portions and/or the bottom portions of the holding concave portions. By having the abovementioned shape, it is possible to reduce heat capacity of the bottom portion of the holding concave portion as well as favorably securing its mechanical strength.

Figure 19:
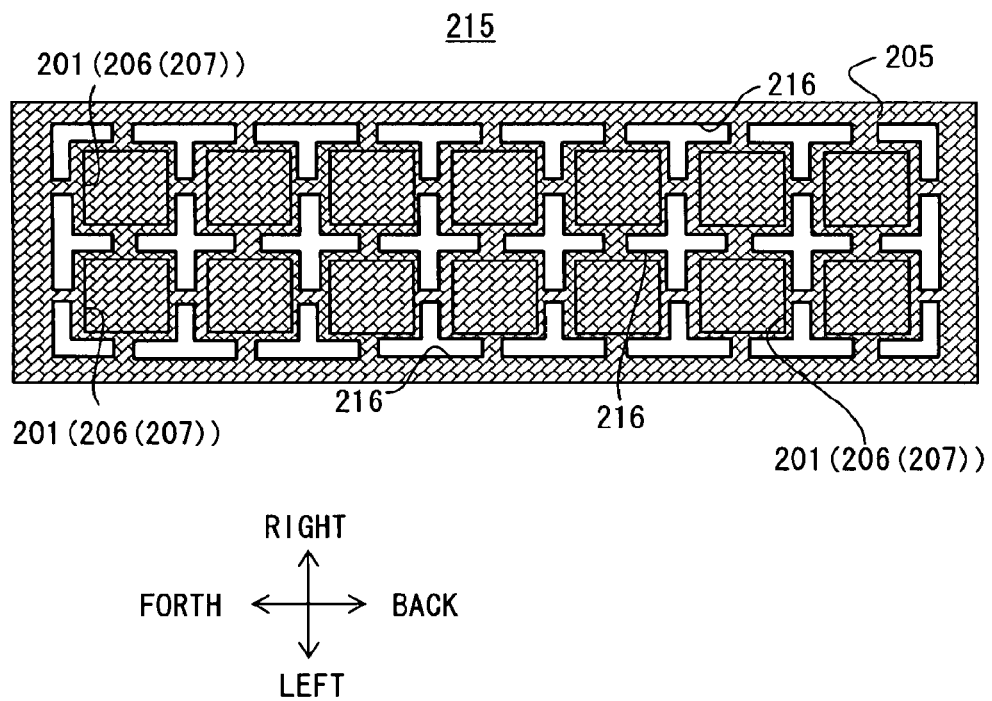
FIG. 19 is a schematic top view of a heat treatment jig according to another embodiment of the present invention.

In the above embodiment, an example is explained in which the through-holes 202, which are slit-like void parts in line shape, are formed near and facing position of the surfaces constituting the sidewalls 207 of holding concave portions 201. However the form of the void parts is not limited to this. FIG. 19 is a schematic top view of a heat treatment jig 215 having through-holes 216 that are different from the example of the embodiment shown in FIG. 1. The heat treatment jig 215 includes a substrate 205, holding concave portions 201, and through-holes 216. As shown in FIG. 19, the through-holes 216 are formed near the corner parts of the sidewalls 207 of the holding concave portions 201.

Figure 20:
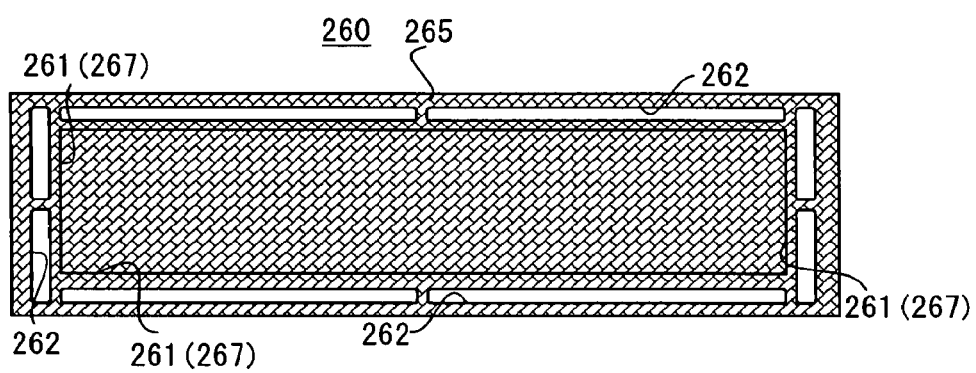
FIG. 20 is a schematic top view of a heat treatment jig according to another embodiment of the present invention.

Further in the example of the embodiment shown in FIG. 1, a plurality of holding concave portions 201 are formed in array. However it is not limited to this. FIG. 20 is a schematic top view of a heat treatment jig 260, in which a large rectangle holding concave portion 261 is formed to a substrate 265. Thus the embodiment can be incorporated to a heat treatment jig having one holding concave portion. For the heat treatment jig 260, to each of near the surfaces constituting sidewalls 267 of the holding concave portions 261, two through-holes 262, which are slit-like void parts in line shape, are provided to each of the forth edge part and back edge part, which are long side direction, and two through-holes 262 are formed each to the left and right edge part, which are short side direction. An object (not shown) is inserted and held as in the example of FIG. 2.

Figure 21A:
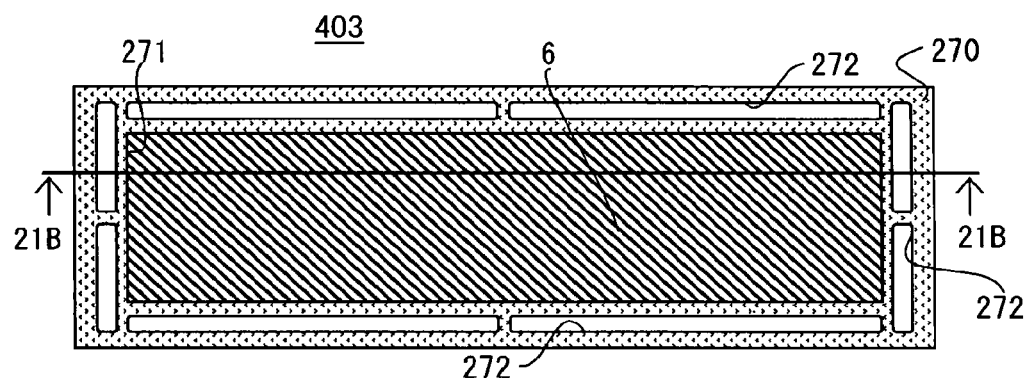
FIG. 21A is a schematic top view showing a heat treatment jig set having a jig cover mounted to the heat treatment jig of FIG. 20.
Figure 21B:
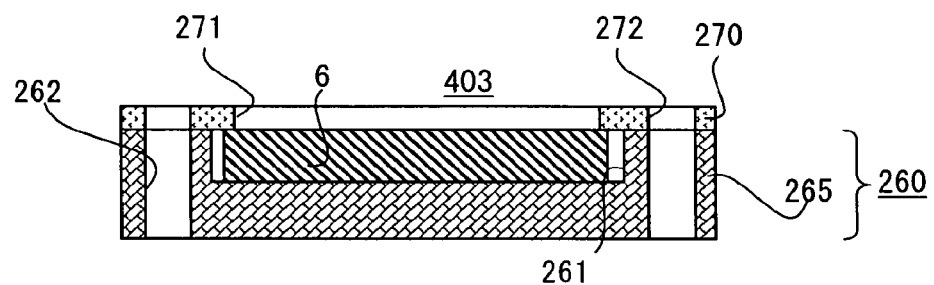
FIG. 21B is across sectional diagram showing the cut section taken along the line 21B-21B of FIG. 21A.

FIG. 21A is a schematic top view of a heat treatment jig set 403 having a jig cover 270 mounted to the heat treatment jig 260. FIG. 21B is a cross sectional diagram showing the cut section taken along the line 21B-21B of FIG. 21A. The jig cover 270 is formed to be flat and almost same shape as the substrate 265 of the heat treatment jig 260. For the jig cover 270, one rectangle aperture 271 is formed to the position corresponding to where the holding concave portion 261 of the heat treatment jig 260 is formed. The aperture area of the aperture 271 is smaller than that of the holding concave portion 261 for holding the top peripheral portion of the object. Further, holes 272 are formed to the position corresponding to the through-holes 262 that are provided to the substrate 265 of the heat treatment jig 260. As shown in FIG. 21B, the object 6 is mounted and held in the holding concave portion of the heat treatment jig 260. Then the jig cover 270 is mounted to the top face of the heat treatment jig 260 so as to hold the object 6 from the top face thereof.

Figure 22A:
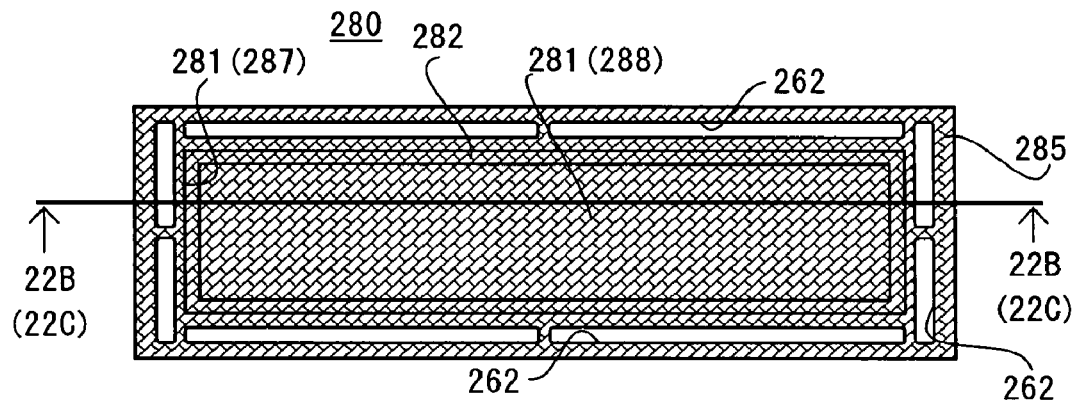
FIG. 22A is a schematic top view of a heat treatment jig according to another embodiment of the present invention.
Figure 22B:
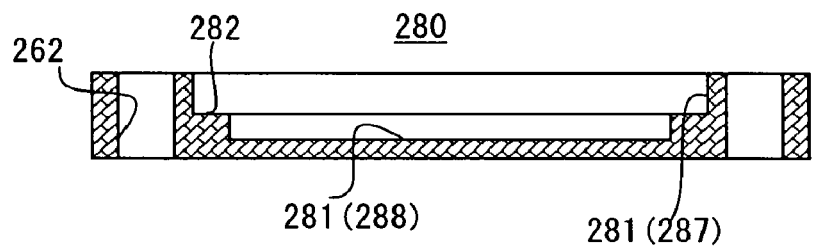
FIG. 22B is a cross sectional diagram showing the cut section taken along the line 22B-22B of FIG. 22A.
Figure 22C:
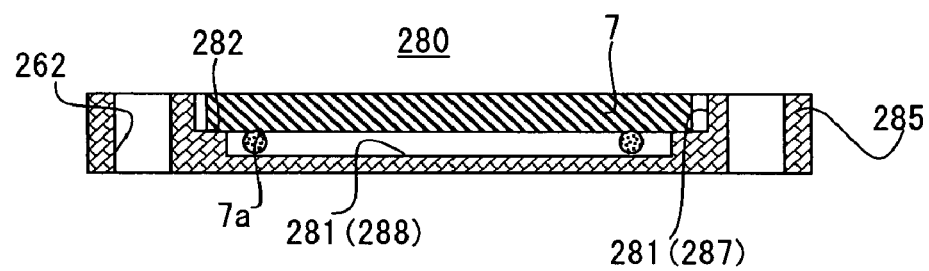
FIG. 22C is a cross sectional diagram showing the cut section taken along the line 22C-22C of FIG. 22A when mounting an object to a holding concave portion of FIG. 22A.

FIG. 22A is a schematic top view of a heat treatment jig 280 according to another embodiment that is different from the example of FIG. 21A. FIG. 22B is a cross sectional diagram showing the cut section taken along the line 22B-22B of FIG. 22A. FIG. 22C is a cross sectional diagram showing the cut section taken along the line 22C-22C when mounting an object 7 to a holding concave portion 281 of FIG. 22A. For the heat treatment jig 280, one large holding concave portion 281 is formed and the through-holes 262, which are void parts, are formed near the surfaces constituting the sidewalls which are inner walls of the holding concave portion 281 are formed. Two of the through-holes 262 are formed each to both edge parts in the long side direction, and two of the through-holes 262 are formed each to the edge parts in short side direction of the substrate 285. Further, a supporting bump portion 282 is formed in the peripheral part of a bottom portion 288 of the holding concave portion 281.

The object 7 is for example a large-sized semiconductor device having a flip-chip bonding configuration with solder balls 7*a* in the peripheral part of the bottom face thereof (see FIG. 22C). However as supporting bump portion 282 is provided, peripheral part of the bottom face of the object 7 can be supported by the supporting bump portion 282 without buffering the solder balls 7*a*. Further, it is possible to prevent from generating variations in reflow profile inside the object 7 supported as set above. Note that the jig cover 270 shown in FIG. 21 may be mounted to the heat treatment jig 280.

Figure 23A:
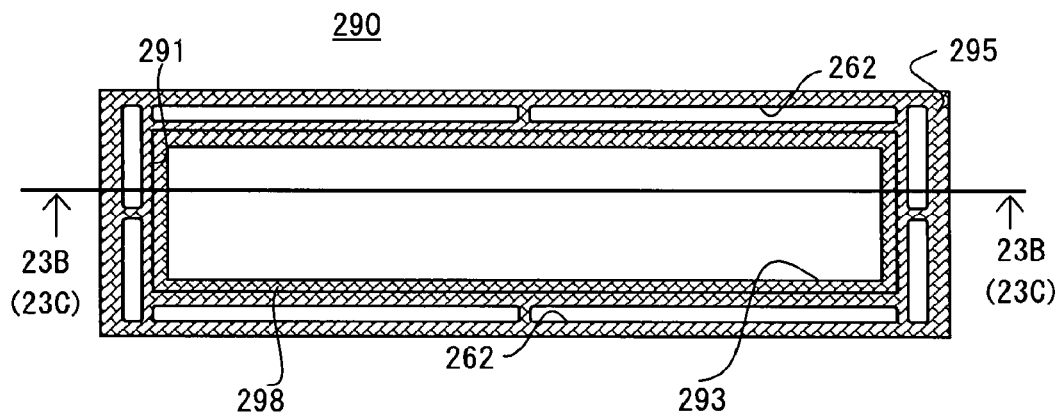
FIG. 23A is a schematic top view of a heat treatment jig according to another embodiment of the present invention.
Figure 23B:
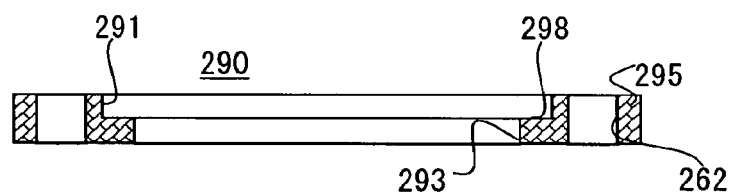
FIG. 23B is a cross sectional diagram showing the cut section taken along the line 23B-23B of FIG. 23A.
Figure 23C:
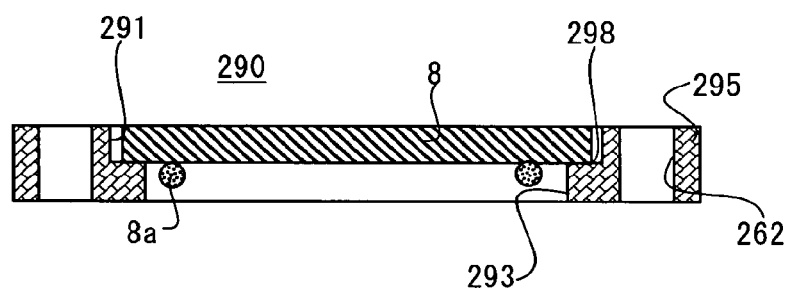
FIG. 23C is across sectional diagram showing the cut section taken along the line 23C-23C of FIG. 23A when mounting an object to a holding concave portion of FIG. 23A.

FIG. 23A is a schematic top view of a heat treatment jig 290 according to another embodiment. FIG. 23B is a cross sectional diagram showing the cut section taken along the line 23B-23B of FIG. 23A. FIG. 23C is a cross sectional diagram showing the cut section taken along the line 23C-23C when mounting an object 8 to a holding concave portion 291 of FIG. 23A. As shown in FIG. 23B, the heat treatment jig 290 leaves peripheral part of the holding concave portion 291 as a bottom portion 298 and other area is aperture 293. The number and shape of the through-holes 262 for the heat treatment jig 290 are identical to the above heat treatment jig 280. Thus the explanation will not be repeated here. As for the object 8, a large semiconductor device having a flip-chip bonding configuration with solder balls 8*a* formed to the bottom face thereof.

As shown in FIG. 23C, for the heat treatment jig 290, the bottom portion 287 is provided to the part where the solder balls 8*a* are not formed, which is specifically the peripheral part of the bottom face of the object 8. Thus the object 8 can be supported without buffering the solder balls 8*a*. Incidentally, the jig cover 270 as shown in FIG. 21 may be mounted to the heat treatment jig 290. For a substrate 295 of the heat treatment jig 290, as the apertures 293 are formed to the bottom portion of the holding concave portions 291, heat capacity thereof can be reduced.

Figure 24A:
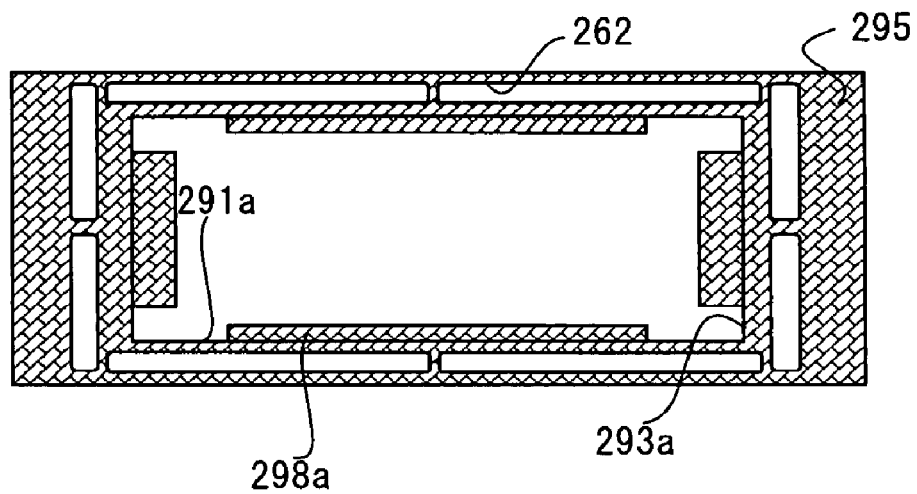
FIG. 24A is a partial enlarged top view of a heat treatment jig according to another embodiment of the present invention.
Figure 24B:
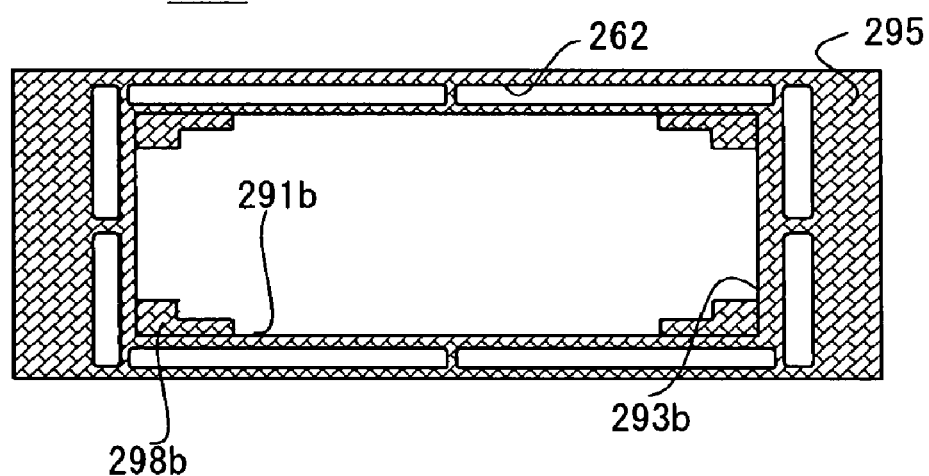
FIG. 24B is a partial enlarged top view of a heat treatment jig according to another embodiment of the present invention.

The shapes of the bottom portion of the holding concave portion and aperture may be modified in various ways. An example of modifications for the bottom portion of the holding concave portion is illustrated hereinafter in FIGS. 24A to 24H. Incidentally, in FIGS. 24A to 24H, as only the shape of the bottom portion of the holding concave portion is different, explanation for other portions is omitted. FIG. 24A is a top view of a holding concave portion 291a provided to a heat treatment jig 290a. As shown in FIG. 24A, a bottom portion 298a of the holding concave portion 291a has its corners being cut as compared to the bottom portion 298 of the heat treatment jig 290 shown in FIG. 23A. FIG. 24B is a top view of a holding concave portion 291b provided to a heat treatment jig 290b. On the contrary, a bottom portion 298b of the holding concave portion 291b has corners left and other parts being cut.

Figure 24C:
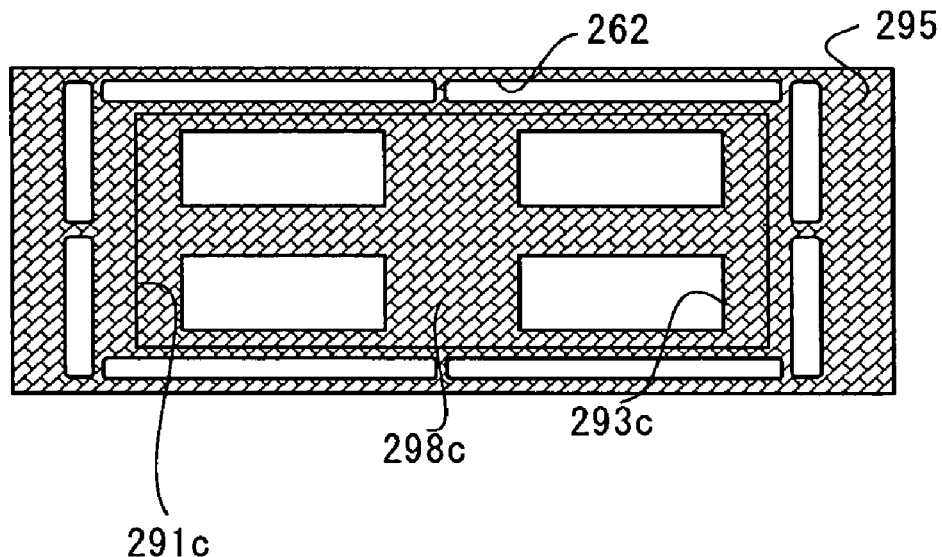
FIG. 24C is a partial enlarged top view of a heat treatment jig according to another embodiment of the present invention.
Figure 24D:
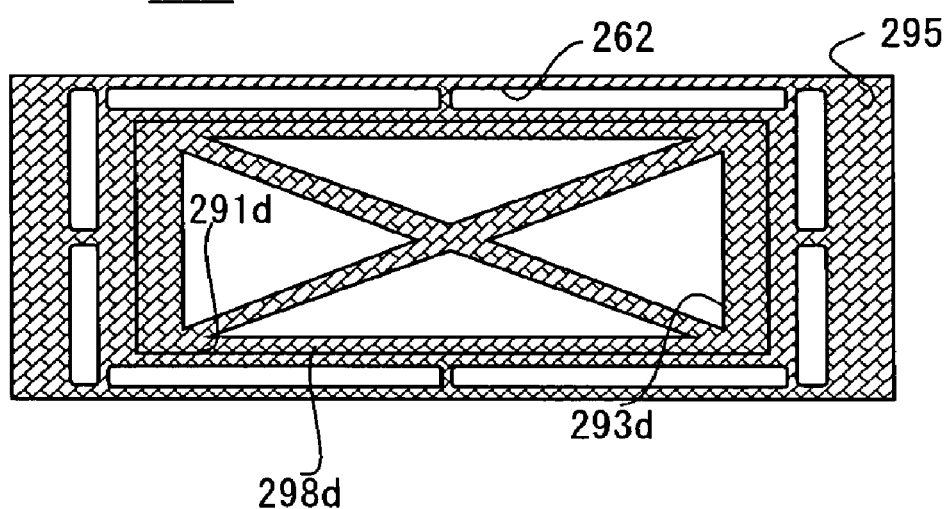
FIG. 24D is a partial enlarged top view of a heat treatment jig according to another embodiment of the present invention.
Figure 24E:
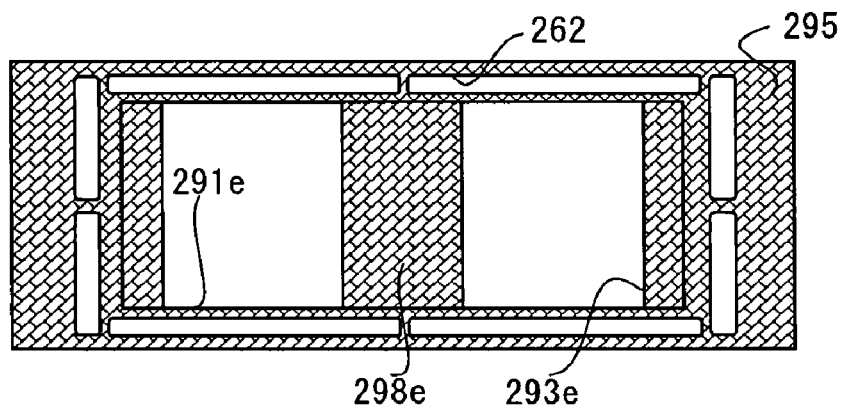
FIG. 24E is a partial enlarged top view of a heat treatment jig according to another embodiment of the present invention.
Figure 24F:
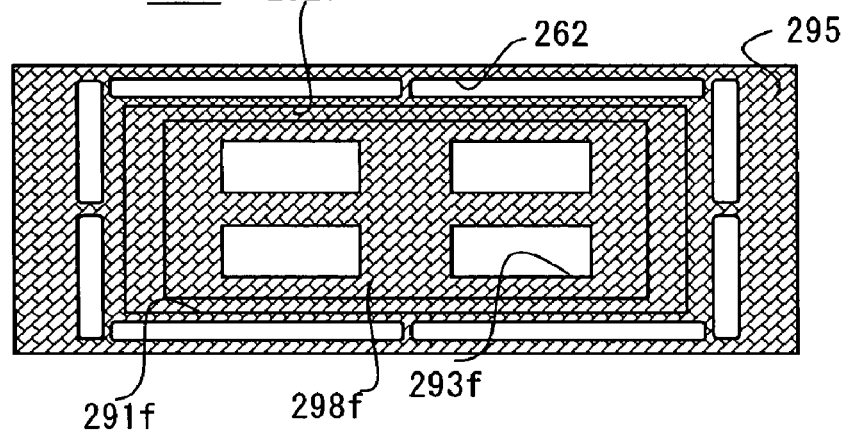
FIG. 24F is a partial enlarged top view of a heat treatment jig according to another embodiment of the present invention.
Figure 24G:
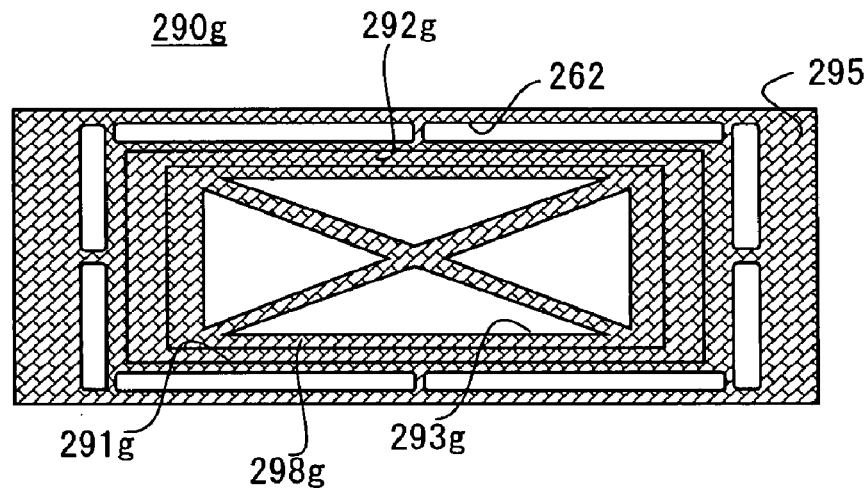
FIG. 24G is a partial enlarged top view of a heat treatment jig according to another embodiment of the present invention.
Figure 24H:
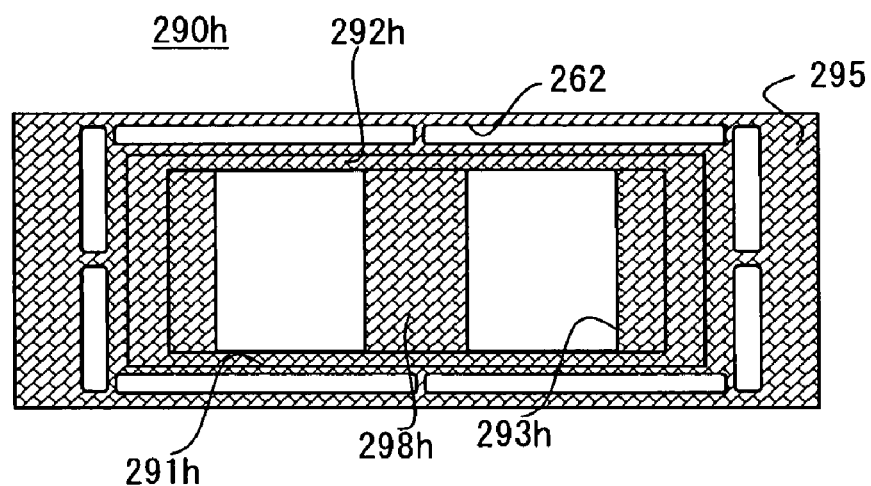
FIG. 24H is a partial enlarged top view of a heat treatment jig according to another embodiment of the present invention.

FIG. 24C is a partial enlarged top view of a holding concave portion 291c provided to a heat treatment jig 290c. As shown in FIG. 24C, 2×2 of apertures 293c vertically and horizontally are provided to a bottom portion 298c of the holding concave portion 291c of the heat treatment jig 290c. FIG. 24D is a top view of a holding concave portion 291d provided to a heat treatment jig 290d. FIG. 24E is a top view of a holding concave portion 291 mounted to a heat treatment jig 290e. The heat treatment jig 290d has apertures formed by cutting areas other than the peripheral and diagonal line parts of a bottom portion 298d of the holding concave portion 291d. Specifically as shown in FIG. 24D, four triangular apertures 293d are formed. As shown in FIG. 24E, for a bottom portion 298e of a holding concave portion 291e of the heat treatment jig 290e, one side edge part, a facing edge part thereof and an area facing in parallel to the edge parts are remained as the bottom portion 298e and other parts are being cut to form apertures 293e. FIGS. 24F to 24H are partial enlarged top views showing holding concave portions (291f, 291g and 291h in order) provided to the substrate 295 of heat treatment jigs (290f, 290g and 290h in order). For each of the holding concave portions, supporting bump portions (292f, 292g and 292h in order) are provided to bottom portions (298f, 298g and 298h in order) as shown in each of the drawings. Further, apertures (293f, 293g and 293h in order) are provided to the supporting bump portions and/or the bottom portions. By having the abovementioned shape, it is possible to reduce heat capacity of the bottom portion of the holding concave portion as well as favorably securing its mechanical strength.

Figure 25:
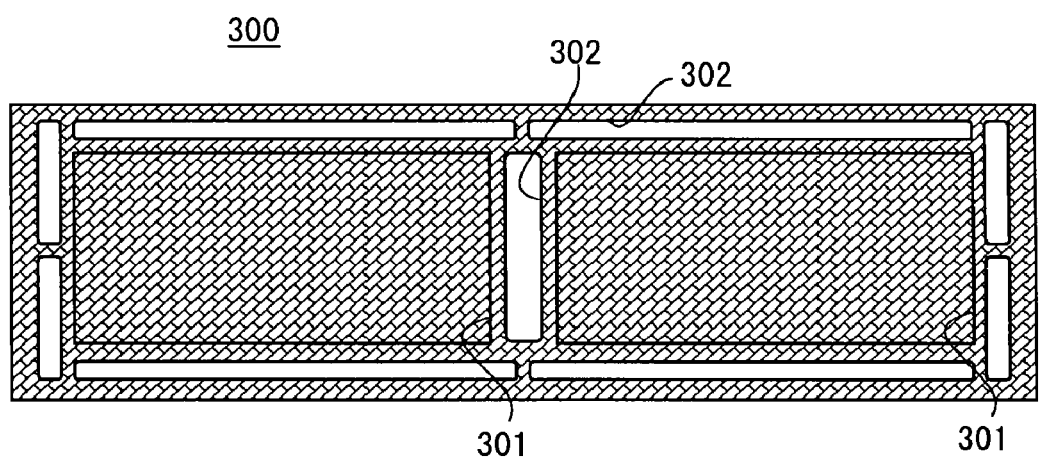
FIG. 25 is a schematic top view of a heat treatment jig according to another embodiment of the present invention.

Furthermore as shown in FIG. 25, two large-sized holding concave portions 301 may be formed in back and forth directions to a heat treatment jig 300. For the heat treatment jig 300, slit-like through-hole 302 is formed each to outside of the holding concave portions 301.

Moreover, two through-holes 302, which are slit-like void parts in line shape are formed to each of the back and forth edges ad indicated by the arrows in the drawing near the sidewalls constituting the short sides of the holding concave portions 301 in the heat treatment jig 300. Furthermore, in the facing area two holding concave portions 301, one wide slit-like through-hole 302 is formed.

For the heat treatment jig 300, the through-holes 302, which are slit-like void parts in line shape, are formed in the optimum shape near each of the surface constituting the sidewalls of the two holding concave portions 301. Thus reflow profile inside object held by the two holding concave portions 301 can favorably be same and reflow profile of the object in both of the two holding concave portions can favorably same.

Figure 26A:
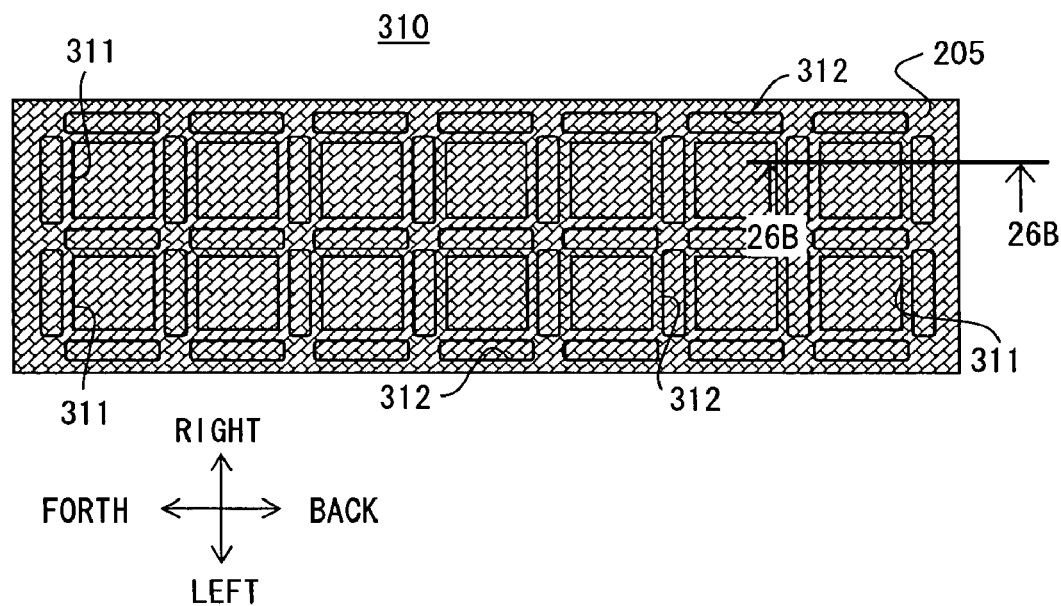
FIG. 26A is a schematic top view of a heat treatment jig according to another embodiment of the present invention.
Figure 26B:
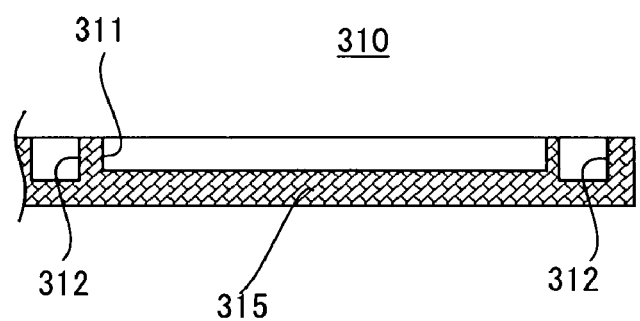
FIG. 26B is across sectional diagram showing the cut section taken along the line 26B-26B of FIG. 26A.

In the above embodiment, it is explained that the through-holes 202 (see FIG. 1A) are formed to be slit-like in line shape. However the through-holes 202 may be formed by a plurality of round holes placed continuously (not shown). Further, the void parts may not be through-holes but may be concave portion. FIGS. 26A and 26B are schematic top views of a heat treatment jig 310 in which the void parts are replaced with concave portions. FIG. 26B is a cross sectional diagram showing the cut section taken along the line 26B-26B of FIG. 26A. The heat treatment jig 310 includes holding concave portions 311 and concave portions 312, which are slit-like void parts in line shape provided near the sidewalls of the holding concave portions 311. As the position to form and arrangement of the concave portions 312 for the holding concave portions 311 are same as the above embodiment, the explanation will not be repeated here. By replacing the through-holes 202 with the concave portions 312, it is possible to reduce warping or the like caused by repeating use and also to improve mechanical strength.

Figure 27A:
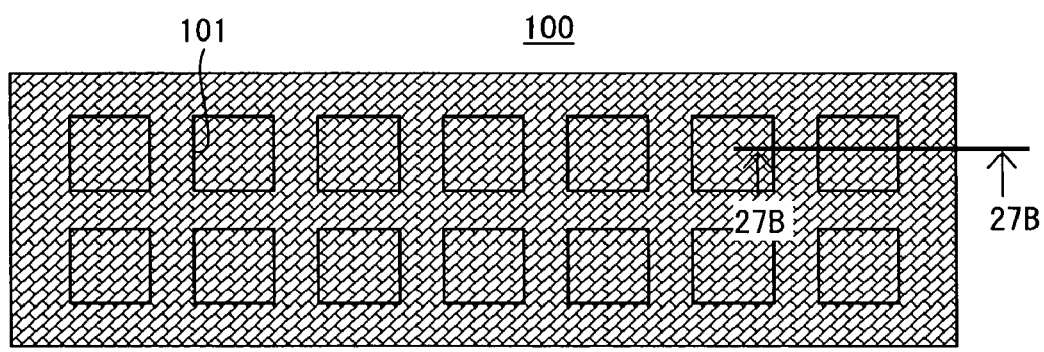
FIG. 27A is a schematic top view of an example of a heat treatment jig.
Figure 27B:
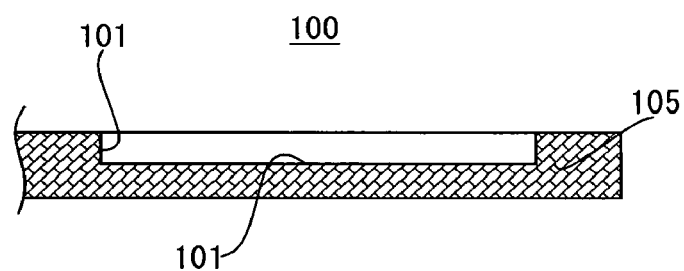
FIG. 27B is a cross sectional diagram showing the cut section taken along the line 27B-27B of FIG. 27A.

A heat treatment jig according to a comparative example is described hereinafter in detail. FIG. 27A is a schematic top view of a heat treatment jig 100 according to the comparative example. FIG. 27B is a cross-sectional diagram showing the cut section taken along the line 27B-27B of FIG. 27A. The heat treatment jig 100 of FIG. 27A has a rectangle substrate 105 in which the sides in back and forth directions indicated by the arrows in the drawing are long side. Further, a plurality of rectangle holding concave portions 101 are formed for mounting and holding objects (not shown). As the holding concave portions 101 mounts and holds the object 9 individually, the shapes of the holding concave portions 101 corresponds to the outer shape of the objects. In the example shown in FIG. 27A, the shapes of the bottom portion of the holding concave portions 101 are squares and 2×7 of holding concave portions 101 are formed to be two lines in lattice in right and left direction (short side direction) as indicated by the arrows in the drawing.

Figure 28A:
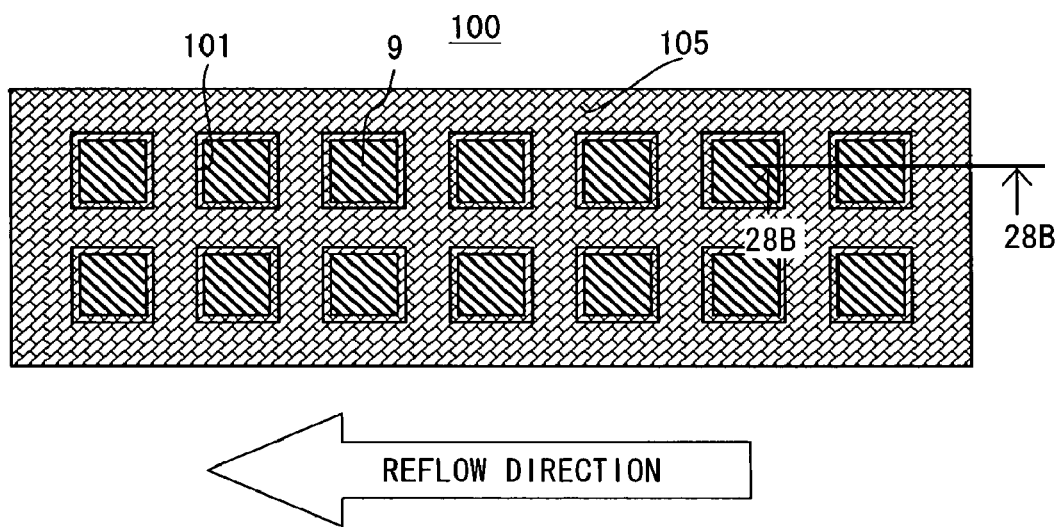
FIG. 28A is a schematic top view showing an example in which an object is mounted to a heat treatment jig.
Figure 28B:
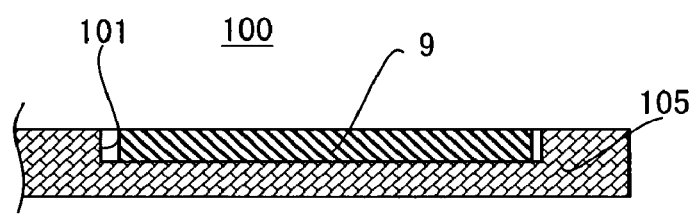
FIG. 28B is across sectional diagram showing the cut section taken along the line 28B-28B of FIG. 28A.
Figure 28C:
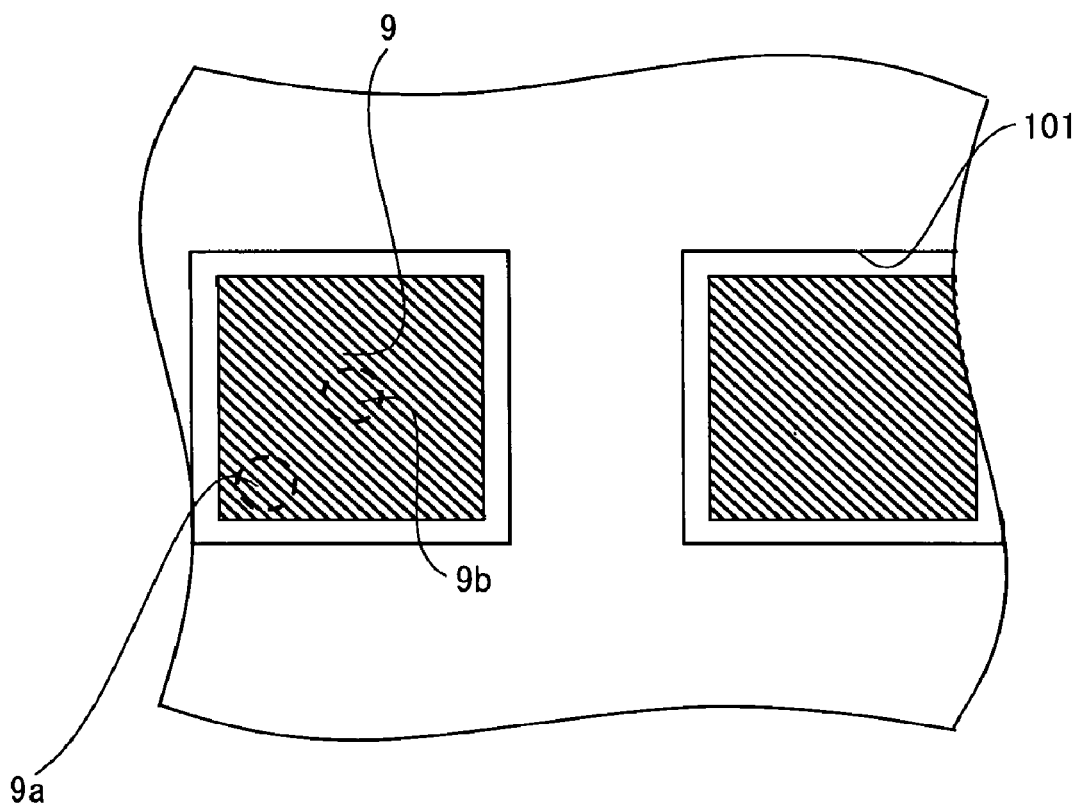
FIG. 28C is a partial enlarged top view of a holding concave portion shown in FIG. 28A.

FIG. 28A is a schematic top view of a heat treatment jig 100 when housing the object in the holding concave portion 101. FIG. 28B is a cross sectional diagram showing the cut section taken along the line 28B-28B of FIG. 28A. FIG. 28C is a partial enlarged top view near the holding concave portion 101 of FIG. 28A. The object 9 is for example a semiconductor device having a basic configuration with chip components mounted to the top face of the wiring substrate.

When performing a reflow process on the object 9 such as a semiconductor device using the heat treatment jig 100, as shown in FIGS. 28A and 28B, firstly the object 9 is inserted to the holding concave portion 101 from above and held therein. Then the heat treatment jig 100 holding the object 9 is thrown into a reflow oven (not shown) to let the heat treatment jig 100 go through in the direction indicated by the arrow saying "reflow direction" in FIG. 28A. By this, a reflow process is performed on the object 8 so that a desired part of the object 9 is jointed (for example jointing chip component with wiring substrate).

If the object 9 is a semiconductor device having chip components mounted to the top face of the wiring substrate, the bottom face of the object 9 is flat. Thus the bottom portion of the holding concave portion 101 in the heat treatment jig 100 is formed to be flat.

Figure 29:
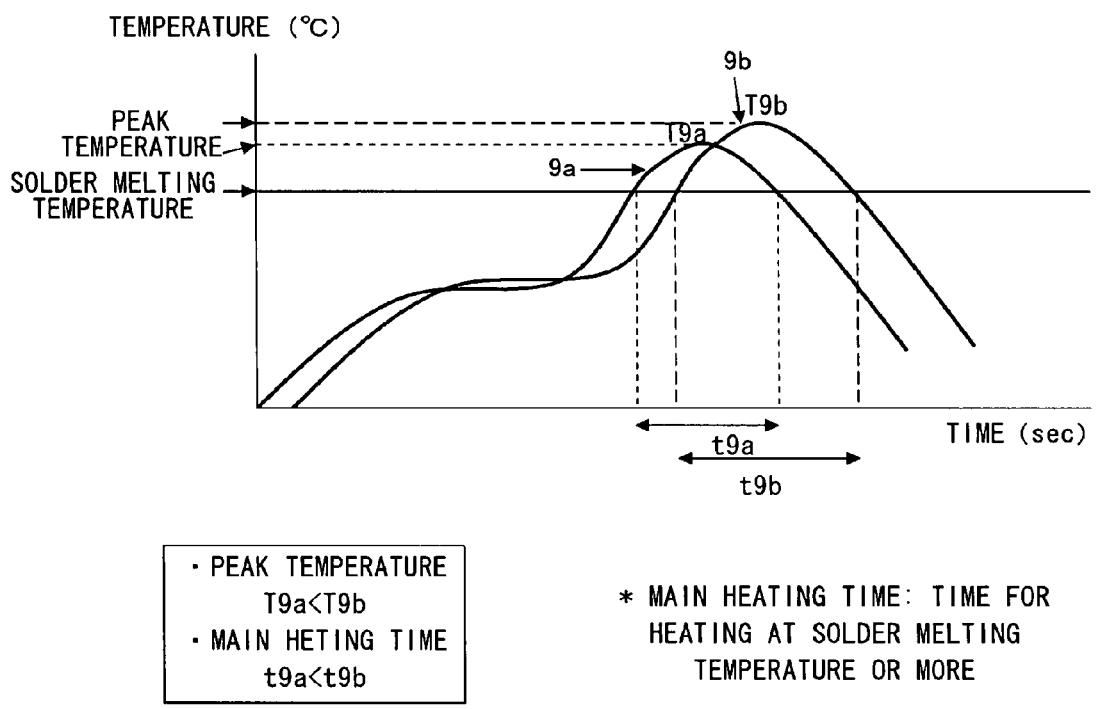
FIG. 29 shows reflow profile plotting temperatures of a corner and central parts to reflow time of object.
Figure 30:
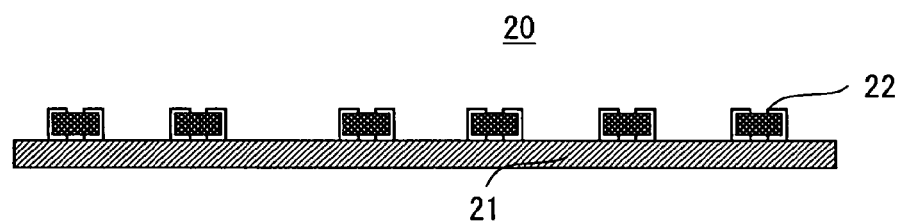
FIG. 30 is a schematic explanation diagram of a semiconductor device having a basic configuration.
Figure 31:
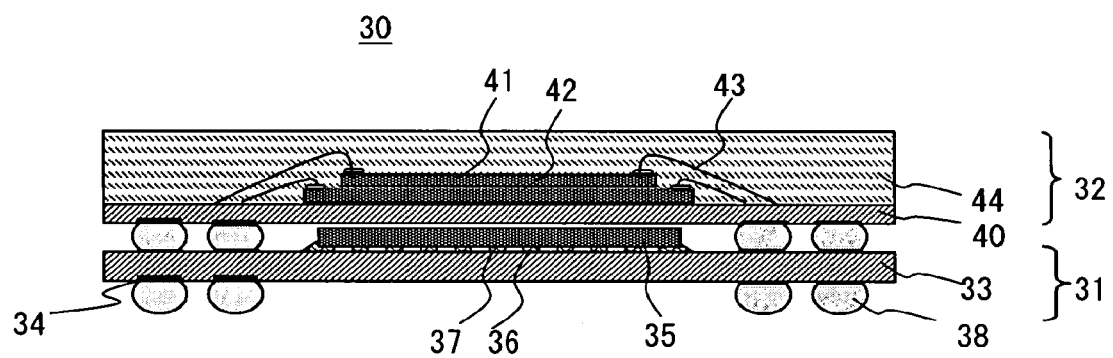
FIG. 31 is a schematic explanation diagram of a semiconductor device having a package-on-package configuration.
Figure 32:
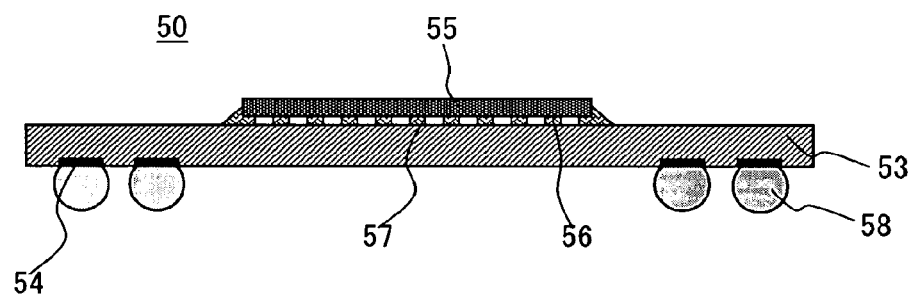
FIG. 32 is a schematic explanation diagram of a semiconductor device having a flip-chip configuration.
Figure 33:
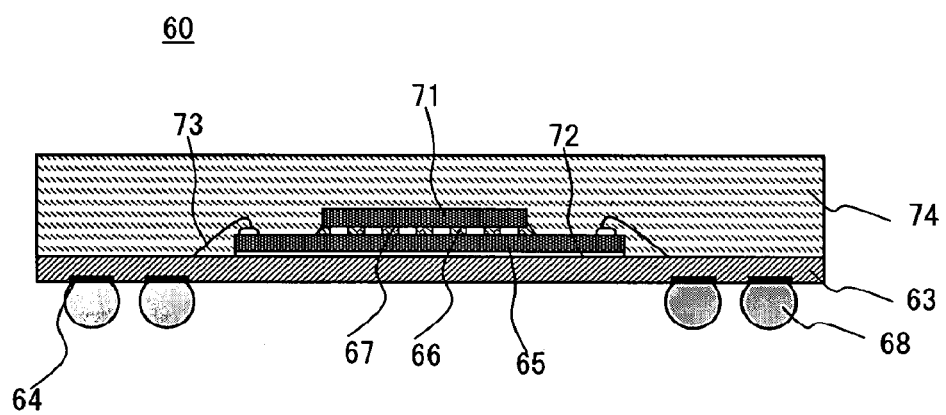
FIG. 33 is a schematic explanation diagram of a semiconductor device having a chip-on-chip configuration.

Here as shown in FIG. 28C, corner part of the object 1 is referred as 1a and central part of the object 1 is referred as 1b. FIG. 29 is a graph plotting temperature profile of these parts to reflow time. In the heat treatment jig 100 of this comparative example, as shown in FIG. 29, time t3a of a corner part 9a of an object 9 to increase to solder melting temperature or more differ from time t3b for a central part 9b of the object 9 to increase to the solder melting temperature or more. Further, reflow profiles (such as temperature profile for peak temperature and time) for the corner part 9a of the object 9 differs from the central part 9b of the object 9.

In the heat treatment jig 100, distances between adjacent holding concave portions are relatively wide. In other words, wide parts of the heat treatment jig 100 exist around the objects. Thus heat conduction from outside part (holding concave touching part and proximal part) of the object 9 is apparent. Thus in the object 9 held by the heat treatment jig 100, a peak temperature of a corner part 9a is lower than a peak temperature of a central part 9b. As a result, reflow profiles of the corner part 9a and central part 9b are different.

It is apparent that the present invention is not limited to the above embodiments, but may be modified and changed without departing from the scope and spirit of the invention.

What is claimed is:

1. A heat treatment jig, comprising:
   a substrate having a main surface including a holding concave portion formed in said main surface, said holding concave portion having sides and a bottom, said bottom being configured to hold an object;
   a void part formed in said main surface adjacent to and outside an inner wall of the holding concave portion, the void part being a through-hole and the void part being formed near each of surfaces constituting a sidewall of the holding concave portion;
   a plurality of the holding concaved portions in array; and
   a common void part formed near sidewalls of the holding concave portions and shared by the plurality of adjacent holding concave portions.

2. The heat treatment jig according to claim 1, further comprising:
   a plurality of the holding concave portions in array; and
   a common void part formed near sidewalls of the holding concave portions and shared by the plurality of adjacent holding concave portions as the void part,
   wherein the void part is formed to be a slit-like shape in a position almost parallel to the sidewall of the holding concave portion, and
   wherein the void part is formed near each of surfaces constituting a sidewall of the holding concave portion.

3. A heat treatment jig, comprising:
   a substrate having a main surface including a holding concave portion formed in said main surface, said holding concave portion having sides and a bottom, said bottom being configured to hold an object;
   a void part formed in said main surface adjacent to and outside an inner wall of the holding concave portion, the void part being a through-hole; and
   a plurality of the holding concave portions,
   wherein the void part is formed near sidewalls of the holding concave portions not adjacent to one another.

4. The heat treatment jig according to claim 3, further comprising:
   a plurality of the holding concave portions in array; and
   a common void part formed near sidewalls of the holding concave portions and shared by the plurality of adjacent holding concave portions.

5. The heat treatment jig according to claim 3, further comprising:
   a plurality of the holding concave portions,
   wherein the void part is formed near sidewalls of the holding concave portions not adjacent to one another,
   wherein the void part is formed near each of surfaces constituting a sidewall of the holding concave portion, and
   wherein the void part is formed to be a slit-like shape in a position almost parallel to the sidewall of the holding concave portion.

6. The heat treatment jig according to claim 5, further comprising:
   a plurality of the holding concave portions in array; and
   a common void part formed near sidewalls of the holding concave portions and shared by the plurality of adjacent holding concave portions.

7. A heat treatment jig, comprising:
   a substrate having a main surface including a holding concave portion formed in said main surface, said holding concave portion having sides and a bottom, said bottom being configured to hold an object;
   a supporting bump portion formed to support the object to the bottom portion of the holding concave portion; and
   a void part formed in said main surface adjacent to and outside an inner wall of the holding concave portion,
   wherein the void part is a through-hole.

8. A heat treatment jig set, comprising:
   a heat treatment jig including a substrate having a main surface including a holding concave portion formed in said main surface, said holding concave portion having sides and a bottom, said bottom being configured to hold an object, and
   a void part formed in said main surface adjacent to and outside an inner wall of the holding concave portion, the void part being formed through the substrate; and
   a detachable jig cover mounted to said main surface of the heat treatment jig to hold at least a part of the object held by the holding concave portion.

9. The heat treatment set according to claim 8, wherein for the jig cover, an aperture is formed to at least a part of the area corresponding to the void part of the heat treatment jig.

10. The heat treatment set according to claim 9, wherein the jig cover, an aperture is formed to at least a part of an area corresponding to the holding concave portion of the heat treatment jig.

11. The heat treatment set according to claim 8, wherein for the jig cover, an aperture is formed to at least a part of an area corresponding to the holding concave portion of the heat treatment jig.

* * * * *